United States Patent [19]
Nikawa

[11] Patent Number: 6,066,956
[45] Date of Patent: May 23, 2000

[54] INSPECTION METHOD AND WIRING CURRENT OBSERVATION METHOD FOR SEMICONDUCTOR DEVICE

[75] Inventor: Kiyoshi Nikawa, Tokyo, Japan

[73] Assignee: NEC Corporation, Tokyo, Japan

[21] Appl. No.: 08/751,725

[22] Filed: Nov. 18, 1996

[30] Foreign Application Priority Data

Nov. 21, 1995 [JP] Japan ................................ 7-302649

[51] Int. Cl.⁷ .................................................. G01R 31/00
[52] U.S. Cl. .................................................... 324/752
[58] Field of Search .................................. 324/750, 751, 324/752, 501, 522, 765; 250/310, 311, 492.1, 492.2; 438/14, 18; 257/40, 48

[56] References Cited

U.S. PATENT DOCUMENTS

| | | | |
|---|---|---|---|
| 4,578,641 | 3/1986 | Tiedje | 324/767 |
| 4,786,865 | 11/1988 | Arimura et al. | 324/765 |
| 5,422,498 | 6/1995 | Nikawa et al. | 324/501 |
| 5,493,236 | 2/1996 | Ishii et al. | 324/501 |
| 5,532,607 | 7/1996 | Inuzuka et al. | 324/750 |
| 5,659,244 | 8/1997 | Sakaguchi | 324/752 |

FOREIGN PATENT DOCUMENTS 6-300824  10/1994  Japan .
7-167924  7/1995   Japan .
7-025758  2/1996   Japan .

OTHER PUBLICATIONS

T. Koyama et al., "New non–bias optical beam induced current (NB–OBIC) technique for evaluation of Al interconnects", *IEEE*, 1995, pp. 228–233 (Month Available).

*Primary Examiner*—Vinh P. Nguyen
*Attorney, Agent, or Firm*—Sughrue, Mion, Zinn Macpeak & Seas, PLLC

[57] ABSTRACT

Infrared laser beam (11) is irradiated onto an integrated circuit (12) as a sample mounted on a sample stage (21) from an infrared laser beam source (23) through a microscope section body (24) and an objective lens (25). A constant voltage source (15) is connected to a power source terminal of the integrated circuit (12). A variation in a current due to a variation in a resistance of a wiring portion due to the irradiation is produced at a ground terminal of the integrated circuit (12). A current variation inspection section (17) detects the current variation. A system control/signal processing section (27) processes the signal and allows an image/waveform display section (28) to display a current image, a defect image or a current waveform. A defect of a wiring may be detected using visible light beam after localization of a suspected failure portion using infrared beam.

6 Claims, 15 Drawing Sheets

Fig. 2

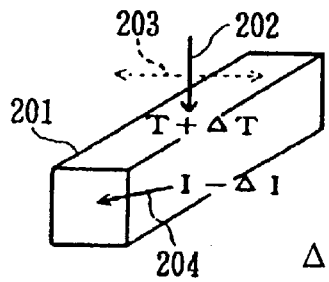

$\Delta I \propto -\Delta R \cdot I$

ΔI: Variation in the current flowing due to irradiation by the beam

ΔR: Variation in the resistance due to irradiation by the beam
Increases when defects such as voids are present T: Temperature of the wiring ΔT: Variation in the temperature of the wiring
Increases when defects such as voids are present

Fig. 3

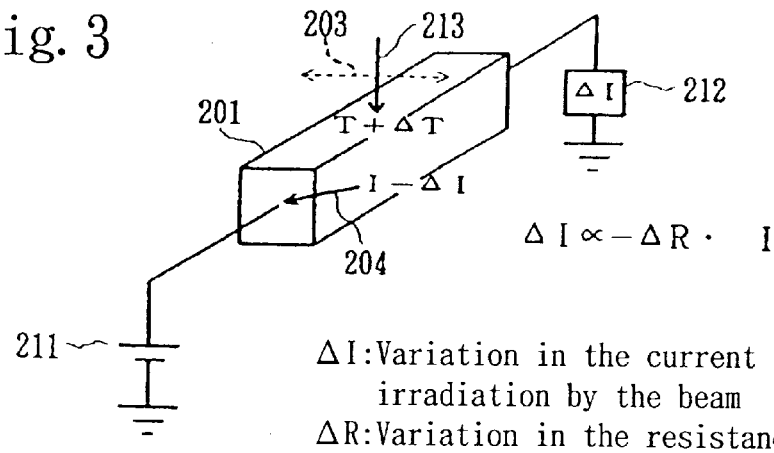

$\Delta I \propto -\Delta R \cdot I$

ΔI: Variation in the current flowing due to irradiation by the beam

ΔR: Variation in the resistance due to irradiation by the beam
Increases when defects such as voids are present T: Temperature of the wiring ΔT: Variation in the temperature of the wiring
Increases when defects such as voids are present

INSPECTION METHOD AND WIRING CURRENT OBSERVATION METHOD FOR SEMICONDUCTOR DEVICE

BACKGROUND OF THE INVENTION

1. Field of the Invention

The present invention relates to a inspection method of a semiconductor device such as a semiconductor integrated circuit and an apparatus for checking the semiconductor device, and more particularly to a wiring current observation and checking method for checking defects in current-carrying paths and the wiring system of wirings formed on a semiconductor integrated circuit chip, and an apparatus for the same.

2. Description of the Related Art

Concerning failure analysis and checking of a semiconductor device such as a semiconductor integrated circuit which is an objective of the present invention, there have been disclosures, for example, in Japanese Patent Laid-Open No. 6-300824, "Inspection Method of Mutual wiring in Semiconductor Integrated Circuit and Apparatus for checking the Same", in Japanese Patent Application No. 7-025758, filed on Feb. 15, 1995, "Testing Method of Wirings on Semiconductor Integrated Circuit Chip and Apparatus for the Same".

FIG. 1 is a structure of a testing apparatus for testing semiconductor devices disclosed in these disclosed documents. An integrated circuit 112 as a tested sample is mounted on a sample stage 111. Laser beam 119 as a visible light emitted from a visible beam emission section 113 is made to be incident on a microscope section 114. The laser beam 119 made to be incident on the microscope section 114 is converged and irradiated onto a chip on the integrated circuit 112. A constant voltage source 115, a current variation detection section 117, and a testing pattern generating section 118 are connected to the sample stage 111. The testing pattern generating section 118 generates testing patterns to set the integrated circuit 112, onto which the laser beam 119 is irradiated, at a prescribed state. Each of these sections 115, 117, and 118 is electrically connected to corresponding pins formed in the integrated circuit 112.

The microscope section 114, the constant voltage source 115, the current variation detection section 117, and the testing pattern generating section 118 are connected to a system control/signal processing section 121 to control the total system and to process the acquired signal. The system control/signal processing section 121 is designed such that it operates a predetermined controlling and signal processing. An image display section 122 is formed of a CRT, and is connected to the system control/signal processing section 121. The image display section 122 is designed such that a current image or a defect image as a result of processing the acquired signal is displayed.

In this testing apparatus for testing semiconductor device, the laser beam as a visible light is irradiated onto the region of the integrated circuit 112 which is a detection objective, with the laser beam scanning on the region. The irradiated light may be electrons or ion beam instead of a laser beam. An increase in resistivity of the integrated circuit due to an increase in temperature caused by the irradiated light is detected as current variation using the current variation detection section 117. The current variations in the wirings are displayed, in synchronization with the scanning by the laser beam 119, on the image display section 122 as brightness variations detected in every irradiated position or as pseudo colors obtained by replacing the brightness with color. Thus, voids in the wirings and Si nodule, i.e. Si precipitates can be detected, and the current flowing through the wirings can be observed.

A principle of such detection and observation will be described briefly below. The current variation due to an increase in temperature at the time of irradiation of the laser beam onto the wirings on the semiconductor chip is expressed as $\Delta I$. When assuming that a constant voltage is applied to both ends of the wiring, the current variation $\Delta I$ can be approximated using the following formula (1).

$$\Delta I \approx -(\Delta R/R)I \tag{1}$$

In the formula (1), R denotes resistivity of the wiring when the laser beam is not irradiated onto the wiring, and $\Delta R$ denotes a variation of the resistance of the wiring due to the irradiation of the laser beam onto the wiring. Furthermore, I denotes current flowing through the wiring when the laser beam is not irradiated onto the wiring.

As described above, if other conditions are unchanged, since the resistance R of the specified wiring to be observed is constant, the observation of the current variation $\Delta I$ makes it possible to acquire the product of the variation of the resistance $\Delta R$ and the current I. Furthermore, when the current I is made constant, the variation of the resistance $\Delta R$ in each position of the wiring can be detected. In addition, the variation of the resistance $\Delta R$ is constant, the value of the current I can be observed. Each of the above mentioned matters will be described individually.

(1) Observation of the Differences among the Variation of the Resistance related to the Positions of the Wiring:

This is disclosed as a detection method of defects such as voids and Si precipitates in Japanese Patent Laid Open No. 6-300824. Specifically, if laser beam conditions, materials of irradiated positions, and shapes of the wiring are same, the differences of the resistance variation of the wiring $\Delta R$ among the detected positions in the wiring are generated due to the differences of the thermal conductivities depending on the detected positions. If there are voids and Si precipitates in the wiring, the thermal conductivities will be different. It is confirmed experimentally that the differences of the resistance variation of the wiring $\Delta R$ can be observed by this effect. The voids and Si precipitates in the wiring are important as factors to determine reliability of the integrated circuit, so that this effect is important. An image observed for this purpose is called a defect image.

(2) Observation of the Current I:

This is disclosed in Japanese Patent Application 7-025758. When aiming at the portion of the wiring having no defects, which is true for normally almost the whole wiring, the current I can be observed. To obtain an absolute value of the current I, it is essential to know the values of the resistance variation of the wiring $\Delta R$ and the resistance R, but it is difficult to know these values. However, it is easy to know the existence of an abnormal current by comparing with a normal current. An image observed for this purpose is called a current image.

In the following description, phenomenon in which resistances of portions irradiated by the laser beam vary is simply called BIRCH (Beam Induced Resistance Change). When this BIRCH is used for a laser, electrons, and ions, this is called OBIRCH respectively (Optical Beam Induced Resistance Change), EBIRCH, and IBIRCH. Here, "O" denotes "Optical", "E" denotes "Electron", and "I" denotes "Ion".

A method called NB-OBIC (Non-bias Optical Beam Induced Current) makes use of thermoelectric effect exerted at heating of the laser beam, as a method using heating by means of beam. This method can be applied effectively to the detection of the voids and the like in the wiring, which has been disclosed in the document for the meeting of Applied Physics Society held in Autumn, 1994, 22a-ZP-10, p. 586, by Koyama et al. This NB-OBIC method differs from the BIRCH method only in that a voltage is not applied to the integrated circuit which is an objective to be detected. Other steps in the NB-OBIC method are the same as those in the BIRCH method. Since the voltage is not applied to the integrated circuit so that no current flows, this NB-OBIC method can not be employed for observation of the current. A fundamental principle of the NB-OBIC method is as follows. When defects are present in a wiring system, a capability of thermal conduction vary near the defects, or thermal conduction state varies. Thus, a thermal gradient is produced near the defects when a laser beam is scanned so that thermoelectric power is produced. It is detected as a current.

There have been the following two severe problems in the foregoing conventional detection method and apparatus for the semiconductor devices. Application of the foregoing conventional method and apparatus to actual semiconductor products is obstructed by this fact.

(1) When a laser beam or electron beam is irradiated onto a chip, electron/hole pairs are generated in a semiconductor substrate, so that a current is generated. When light is irradiated onto the chip, an OBIC (Optical Beam Induced Current) phenomenon appears, and when electrons are irradiated onto the chip, an EBIC ( Electron Beam Induced Current) phenomenon appears. Only the OBIC phenomenon will be described below. The same thing can be said about the EBIC phenomenon.

An OBIC image appears in the form that it overlaps with the foregoing OBTRCH and NB-OBIC images. Normally, an OBIC signal is stronger than OBIRCH and NB-OBIC signals. A dynamic range in a current variation detection system is not wide enough to amplify both signals, so that the OBIRCH and NB-OBIC images are buried by the OBIC image and disappear. In case of a TEG (Test Element Group or Test Structure), it is possible to form a connection so that the OBIC image does not appear. However, in case of products, it is usually impossible. This is one of the severe obstacles to putting into practice the OBIRCH and NB-OBIC methods.

(2) In cases where an ion beam is used instead of the light beam, since the irradiated portions are sputtered, there is a problem that it is difficult to perform a non-destructive test.

SUMMARY OF THE INVENTION

The object of the present invention is to provide a wiring current observation method of a semiconductor device, a wiring current inspection method of the same, and an inspection apparatus of the same, in which electron/hole pairs caused by beam irradiation are not generated, and which is non-destructive unlike the case where an ion beam is employed.

In a first aspect of the present invention, (a) an infrared beam is irradiated onto an observed region of a semiconductor device, (b) a variation of current appearing between prescribed terminals of the semiconductor device upon the irradiation of the infrared beam is detected, so that the wiring current of the observed region is observed.

Specifically, in the first aspect of the present invention, the infrared beam is used as a laser beam. Since the laser beam serves to heat the observed region of the wiring locally, the infrared ray can be used instead of visible light, electron, and ion. Furthermore, the pointed-out problems of the prior art can be solved at once by using the infrared ray. The infrared ray relevant to the present invention means an electromagnetic wave having a wave length more than about 1.24 µm, the energy of which is less than about 1.0 V obtained by subtracting an energy between a donor level and an acceptor level. In case of such infrared beam, electron/hole pairs which are generated with the use of visible laser beam and electron beam are not generated. Furthermore, destructive factors are not found as in the case of an ion beam.

In the first aspect of the present invention, the infrared beam, typically the infrared laser beam, is irradiated onto the observed region of wirings in a semiconductor device such as a semiconductor integrated circuit. Local heating of the wiring produces the variation in resistance of the observed region. Thus, by detecting the variation in the current flowing through the observed region, the wiring current of the semiconductor device is observed. A power terminal or a signal terminal other than the ground terminal may be also used for the detection of the variation in the current. Furthermore, terminals other than the terminal to detect the current variation may be either grounded or opened. By using the infrared beam as a heating means, the observation of the OBIRCH and NB-OBIC images at the stage of products which was impossible becomes possible. It is possible to perform a series of failure analyses from pinpointing of the defective position to physical analysis by one apparatus. Since the infrared beam used in this detection possesses permeability for Si, an irradiation of the infrared beam from the back side of the Si substrate is useful to observe and detect the current passes and the detects. Therefore, an observation for even the lowest wiring in multilayer wiring structure is possible. Furthermore, an observation for an LOC (Lead On Chip) packaged device which has been difficult to observe from a surface of a device is performed easily.

In a second aspect of the present invention, (a) the infrared beam is irradiated onto a region to be observed of a semiconductor device. (b) Accompanying the irradiation of the infrared beam, a variation in voltage appearing between predetermined terminals of the semiconductor device is detected so that the detection for the observed region is carried out. Hence, the semiconductor devices such as semiconductor integrated circuit are checked.

Specifically, according to the second aspect of the present invention, likewise the first aspect of the present invention, local heating for the observed region is performed using the infrared beam. When a variation in voltage is produced between optional terminals of the semiconductor device, the variation in the voltage is detected. The detection of the defects of the wiring is performed using the detection result of the variation in the voltage. Furthermore, to observe the voltage variation in the semiconductor device, a current may be supplied to the semiconductor device to be observed.

In a third aspect of the present invention, the following two steps are used for a detection method of a semiconductor device: (a) a step wherein the infrared beam is irradiated onto the observed region of the semiconductor device, and accompanied with the irradiation by the infrared beam, either a variation in a current flowing through the observed region or a variation in a voltage appearing between optional terminals is detected whereby a portion is suspected of failure is found, and (b) a second step wherein a defect in the wiring is detected using visible beam for the portion suspected of failure found in the first step.

Specifically, in the third aspect of the present invention, in the first step the infrared beam is used to heat the observed region locally as in the first and second aspects of the present invention. The portion suspected of failure is found by detecting the variation in either voltage or current. In the second step, the defects of the wiring are detected by using the visible beam for the portion suspected of failure found in the first step. In the first step, four combinations of the presence of bias application and the detection of either voltage variation or current variation can be adopted.

In a fourth aspect of the present invention, a detection apparatus comprises (a) infrared beam irradiation means for irradiating infrared beam onto an observed region of a semiconductor device from either a front surface or a rear surface of a chip; (b) variation detection means for detecting either a variation in a voltage appearing between certain terminals of a semiconductor device or a variation in a current flowing between the optional terminals; and (c) inspection means for check a failure of the observed region based on the detection result by the variation detection means.

Specifically, in the fourth aspect of the present invention, the inventions recited in the first and second aspects are realized as a detection apparatus, wherein local heating of the observed portion of the semiconductor device is realized using the infrared beam, the variation in either voltage or current at the time of the local heating for the observed portion is detected by the variation detection means, and failure analysis and inspection are performed using the detection result.

In a fifth aspect of the present invention, a detection apparatus of a semiconductor device comprises, (a) infrared beam irradiation means for irradiating infrared beam onto an observed portion of a semiconductor device from either a front surface or a rear surface of a chip; (b) Suspected failure portion judging means by means of detecting either a variation in a voltage appearing between optional terminals of the semiconductor device or a variation in a current flowing between the certain terminals at the time of irradiation of the infrared beam; (c) visible beam irradiation means for irradiating visible beam onto the portion suspected of failure found by the suspected failure portion judging means; and (d) wiring defect detection means by means of detecting either a variation in a voltage appearing between optional terminals or a variation in a current flowing between the optional terminals when the failure suspected portion is irradiated by the visible beam.

Specifically, in the fifth aspect of the present invention, the invention recited in the third aspect is realized as a detection apparatus, wherein the infrared beam is irradiated onto the observed region of the semiconductor device such as a semiconductor integrated circuit using the infrared beam irradiation means, and the suspected failure portion is found using the suspected failure portion judging means, based on either the variation in the voltage appearing between certain terminals of the semiconductor device or the variation in the current flowing between the optional terminals thereof, at the time of the irradiation of the infrared beam. Subsequently, the visible beam is irradiated onto the portion suspected of failure using the visible beam irradiation means. Either the variation in the voltage appearing between the optional terminals or the variation in the current flowing between the optional terminals, at the time of the irradiation of the visible beam, is detected by the wiring defect detection means whereby the defect of the wiring is detected.

In a sixth aspect of the present invention, the detection apparatus of the invention recited in the fifth aspect is constituted such that the infrared beam irradiation means and the visible beam irradiation means are disposed so as to irradiate opposite surfaces of a chip of a semiconductor device. Since the observation from the rear surface of the chip will be possible, it is possible to observe the wiring which can not be seen from the front surface of the chip either depending on the assembly manner or by the presence of an upper layer wiring. It should be noted that means capable of switching the observations from the front and rear surfaces of the observed chip may be equipped with the detection apparatus, in which the visible beam and the infrared beam are irradiated from the same direction and the chip is turned upside down.

In a seventh aspect of the present invention, the detection apparatus of the semiconductor device recited in the fourth, fifth, and sixth aspects further comprises (a) test-pattern generating means for generating test-patterns to realize operation states of a semiconductor device, and (b) test-pattern application means for applying the test-patterns generated by the test-pattern generating means to the semiconductor device. The semiconductor device such as a semiconductor integrated circuit can be set at a prescribed state by inputs of the test-patterns. It is possible to observe the semiconductor device at this prescribed state.

FIG. 2 shows a fundamental conception of the present invention described above. Referring to FIG. 2, infrared beam 202 such as infrared laser beam is irradiated onto a wiring 201 of a semiconductor device. The infrared beam may be scanned in the arrow direction illustrated by a broken line 203 in certain circumstances. When a current 204 flows through the wiring 201, a temperature of the wiring 201 is raised by $\Delta T$ by the irradiation of the infrared beam so that a resistance of the wiring 201 increases by $\Delta R$. As a result, a current reduces by $\Delta I$. The magnitude of a variation $\Delta T$ of the temperature increases when defects such as voids are present, so that a variation $\Delta R$ of the resistance increases. An absolute value $|\Delta I|$ of the variation $\Delta I$ of the resistance also increases. Therefore, the defect detection is possible by detecting the variation of the current $\Delta I$. Furthermore, since the current variation $\Delta I$ is in proportion to the current flowing through the wiring, the observation of the current variation $\Delta I$ teaches the value of the current I.

FIG. 3 shows a fundamental conception of the conventional detection in the semiconductor device using such as visible light. The same reference numerals are given to the same portions of FIG. 3 as those of FIG. 2, and descriptions as to the same portions are omitted appropriately. It is possible to make the current flow through the wiring 201 by connecting a power source 211 to the wiring 201. In the detection apparatus of the present invention, the same effect as in the conventional detection apparatus of the semiconductor device shown in FIG. 3 is obtained. In the conventional detection, visible light laser, electrons, or ion beam 213 is irradiated instead of the infrared beam 202 (FIG. 2). By detecting the various kinds of the variations described using FIG. 2, the inspection of the semiconductor device is performed. Therefore, the foregoing problems are resolved.

The above and other object, features, and advantages of the present invention will become apparent from the following description based on the accompanying drawings which illustrate an example of a preferred embodiment of the present invention.

BRIEF DESCRIPTION OF THE DRAWINGS

FIG. 2 is a schematic perspective view showing a fundamental concept of a inspection apparatus for a semiconductor device of the present invention;

FIG. 3 is a schematic perspective view showing a fundamental concept of the conventional inspection appratus for the semiconductor device;

DETAILED DESCRIPTION OF THE PREFERRED EMBODIMENTS

Embodiments of the present invention will be described with reference to the accompanying drawings in detail.
(First Embodiment)

Figure 1:
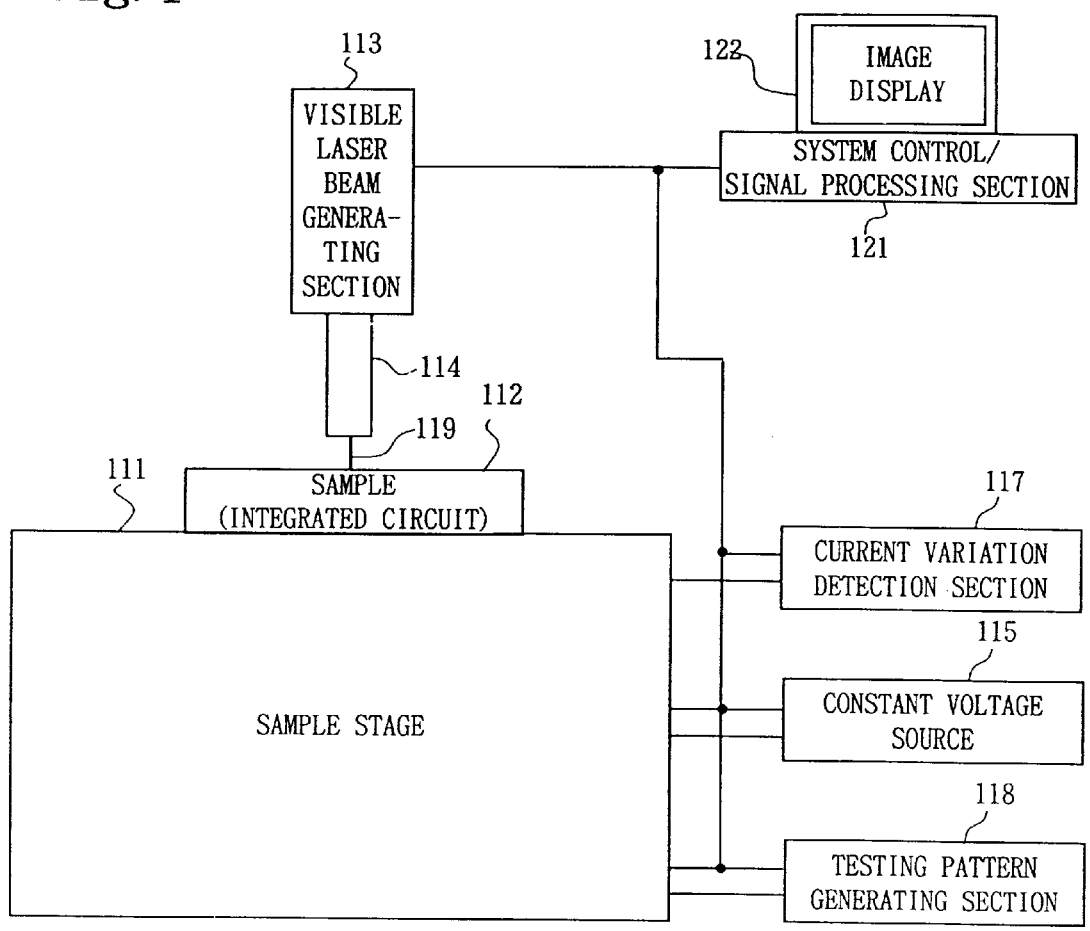
FIG. 1 is a block diagram illustrating a constitution of a conventional inspection apparatus for a semiconductor device.
Figure 4:
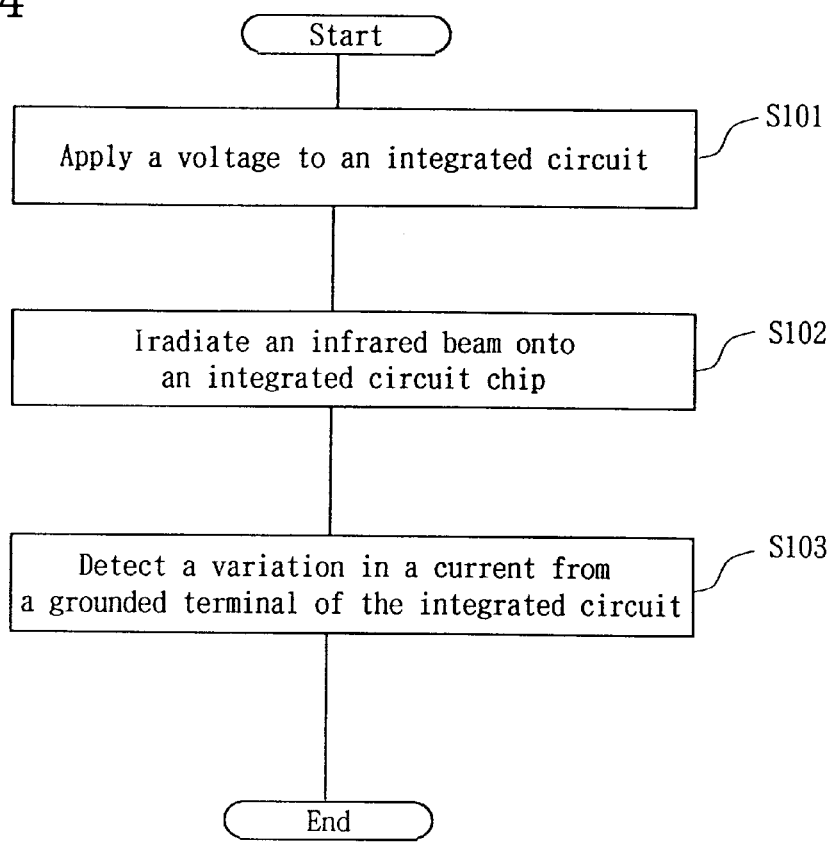
FIG. 4 is a flow chart showing a inspection method for a semiconductor device performed in an inspection apparatus for a semiconductor device of a first embodiment of the present invention.

FIG. 4 shows a principle of an inspection method for a semiconductor device in an inspection apparatus of a semiconductor device of a first embodiment of the present invention. This inspection comprises a first step for applying a voltage to an integrated circuit (Step S101); a second step for irradiating an infrared beam onto an observed region in an integrated circuit chip (Step S102); and a third step for detecting a variation in a current flowing from a grounded terminal of the integrated circuit at the time the infrared beam is irradiated onto the observed region (Step S103).

The inspection of the current variation in Step S103 is also possible by using a power source terminal or a signal terminal instead of the grounded terminal, However, if an output is left opened, the total amount of the current flowing through the integrated circuit flows into the grounded terminal. Therefore, the grounded terminal is most suitable to detect variations of a voltage or a current. If a test-pattern to set the integrated circuit at a prescribed state are inputed from an input terminal at the time of such inspection of the variation, an observation at this state of the integrated circuit will be possible.

A method to detect a defect of a wiring at the same step as FIG. 4 is disclosed in Japan Patent Laid Open No. 7-167924, "Inspection Apparatus of Internal Mutual Wiring in Semiconductor Integrated Circuit". The inspection method of the present invention differs in that the defect of the wiring is not detected, but a current flowing through the wiring is observed.

Figure 5:
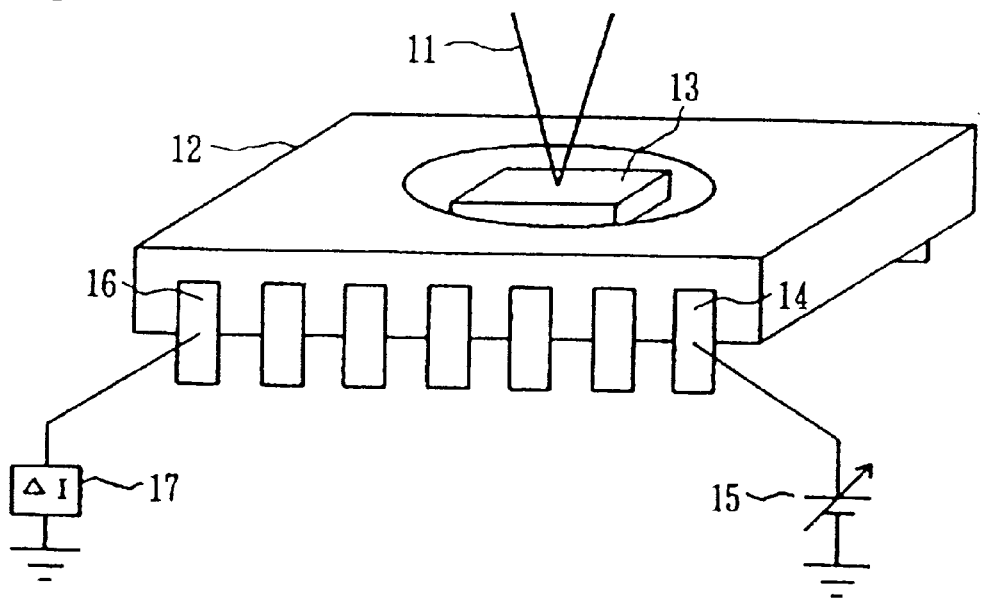
FIG. 5 is a schematic perspective view showing a principle of the inspection apparatus for the semiconductor device in the first embodiment.

FIG. 5 shows a principle of a inspection apparatus for the semiconductor device in the first embodiment. Infrared laser beam 11 as infrared beam is irradiated onto an integrated circuit chip 13 of an integrated circuit 12 instead of visible laser beam by a conventional OBIRCH. A constant power source 15 having one terminal grounded is connected to a power source terminal 14 of the integrated circuit 12. A current variation inspection section 17 to detect the current variation is connected to the connection node of a ground terminal 16 and a ground.

In the current variation inspection section 17, when it is assumed that the current variation by the irradiation of the infrared beam be $\Delta I$ and the resistance variation by the irradiation of the infrared beam be $\Delta R$, the following formula (2) will hold.

$$\Delta I \, \Delta R \cdot I \tag{2}$$

In the formula (2), symbol I means the value of the current flowing through the wiring onto which the infrared beam is irradiated. When defects such as voids are present in the wiring, the resistance of the wiring increases. Thus, the variation of the value of the current flowing through the wiring is produced.

In the first embodiment of the present invention, it is possible to observe an OBIRCH image and an NB-OBIC image at the product stage by using the infrared beam as heating means, which was impossible in the conventional inspection method. Therefore, a series of analyses, from pinpointing of a defective portion to a physical analysis, is possible with one apparatus.

Figure 6:
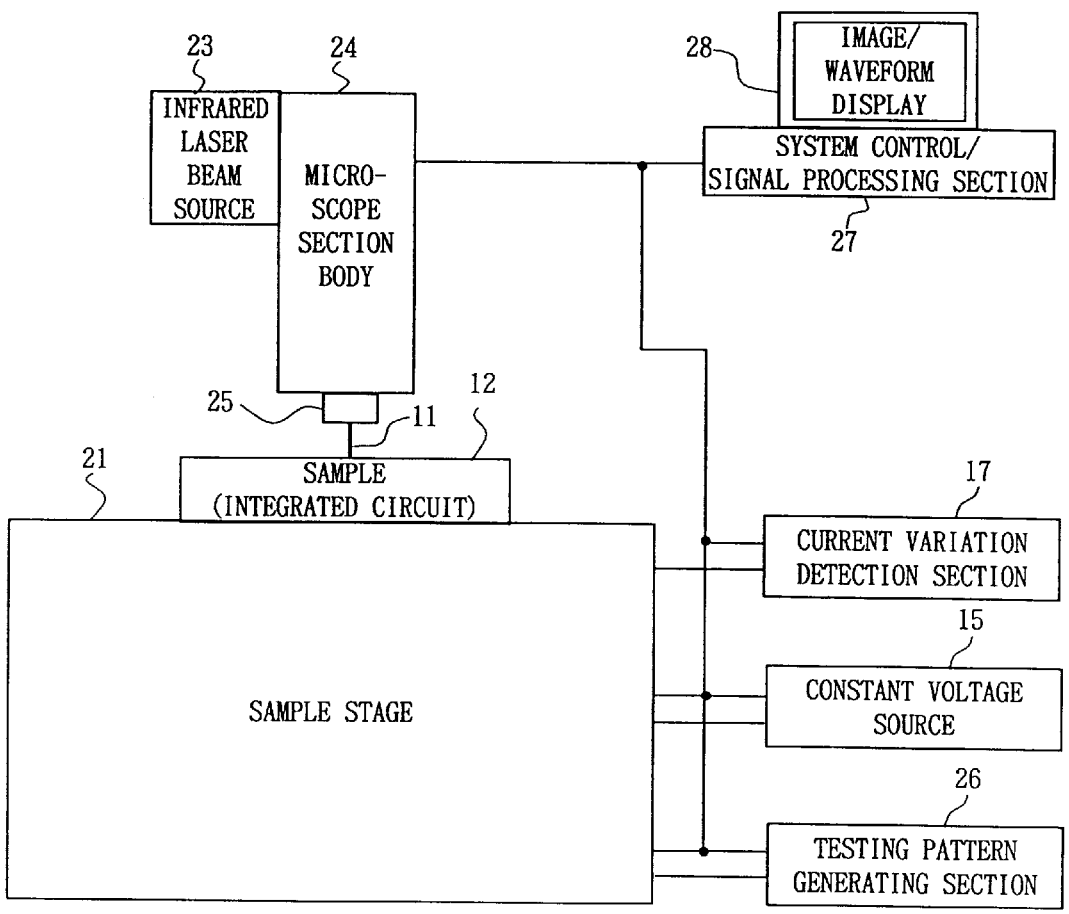
FIG. 6 is a block diagram illustrating a constitution of the inspection apparatus for the first embodiment.

FIG. 6 illustrates a constitution of the inspection apparatus for the semiconductor device in the first embodiment. An integrated circuit 12 as a sample is mounted on a sample stage 21. Infrared laser beam 11 is used as infrared beam in the first embodiment. An infrared laser beam source 23 is prepared for generating the infrared laser beam 11. The infrared laser beam 11 emitted from the infrared laser beam source 23 is incident on a microscope body 24, and is converged to be irradiated onto the chip of the integrated circuit 12 via an objective lens 25. The constant voltage power source 15 and the current variation inspection section 17 which are also shown in FIG. 5 are connected to the sample stage 21. Furthermore, the test-pattern generating section 26 is also connected to the sample stage 21. The test-pattern generating section 26 serves to generate test-patterns to set the integrated circuit 12 as a sample at a certain state. These sections 15, 17, and 26 connected to the sample stage 21 are connected electrically to corresponding pins of the integrated circuit 12.

The constant voltage power source 15, the current variation inspection section 17, the microscope body 24, and the test-pattern generating section 26 are connected to a system control/signal processing section 27 which serves to control the whole of the system and to process the acquired signals. The system control/signal processing section 27 comprises a CPU (Central Processing Unit), an ROM (Read Only Memory) storing a control program for the inspection apparatus, and an RAM (Random Access Memory) for operations of the inspection apparatus, and this section 27 is designed so as to perform the predetermined control operations and signal processings. An image/waveform display section 28 is formed of a CRT, and is connected to the system control/signal processing section 27. The image/waveform display section 28 serves to display a current image, a defect image, or a current waveform as the results of processing the acquired signals.

The inspection apparatus for the semiconductor device of the first embodiment uses the infrared laser beam instead of the visible laser beam which has been used in the conventional OBIRCH method. This method using the infrared beam is denoted as an IR OBIRCH-BVI method in the specification of the application. It should be noted that "BVI" means the voltage application method and the current inspection method among the bias application methods. There are four variations in the inspection method for the semiconductor device according to whether the bias is applied or not, and according to whether the voltage or the current is detected. In the first embodiment of the present invention, one of the four variations is dealt with. The other three variations are described as second to fourth embodiments.

The sample stage 21 is designed so as to be movable freely in three directions along the X, Y, and Z axes. After the integrated circuit 12 as the sample is mounted on the sample stage 21, the sample stage 21 mounting the integrated circuit 12 is moved into the position where the infrared laser beam 11 is irradiated onto the integrated circuit 12. Thereafter, electric power is supplied to the integrated circuit 12 from the constant voltage power source 15, and the infrared laser 11 is irradiated onto the region of the integrated circuit 12 to be observed. When the current image and the defect image are observed, the infrared laser beam 11 scans on the observed region. When the current waveform is observed, the infrared laser beam is irradiated only onto one point to be observed. When it is intended to observe the prescribed state of the integrated circuit 12, the test-pattern is generated from the test-pattern generating section 26 to produce a prescribed state, and the irradiation by the infrared laser beam 11 is performed.

It suffices that the wave length of the infrared ray emitted from the infrared laser beam source 23 is more than about 1.24 $\mu$m as described above. It is noted that if the wave length of the infrared laser beam is too long, it can not be converged well. Contrary to this, if the wave length is too short, the OBIC signal will be strong so that it disturbs the OBIRCH signal. In this embodiment, the laser diode emitting the infrared laser having a wave length of 1.3 $\mu$m is used.

Figure 7:
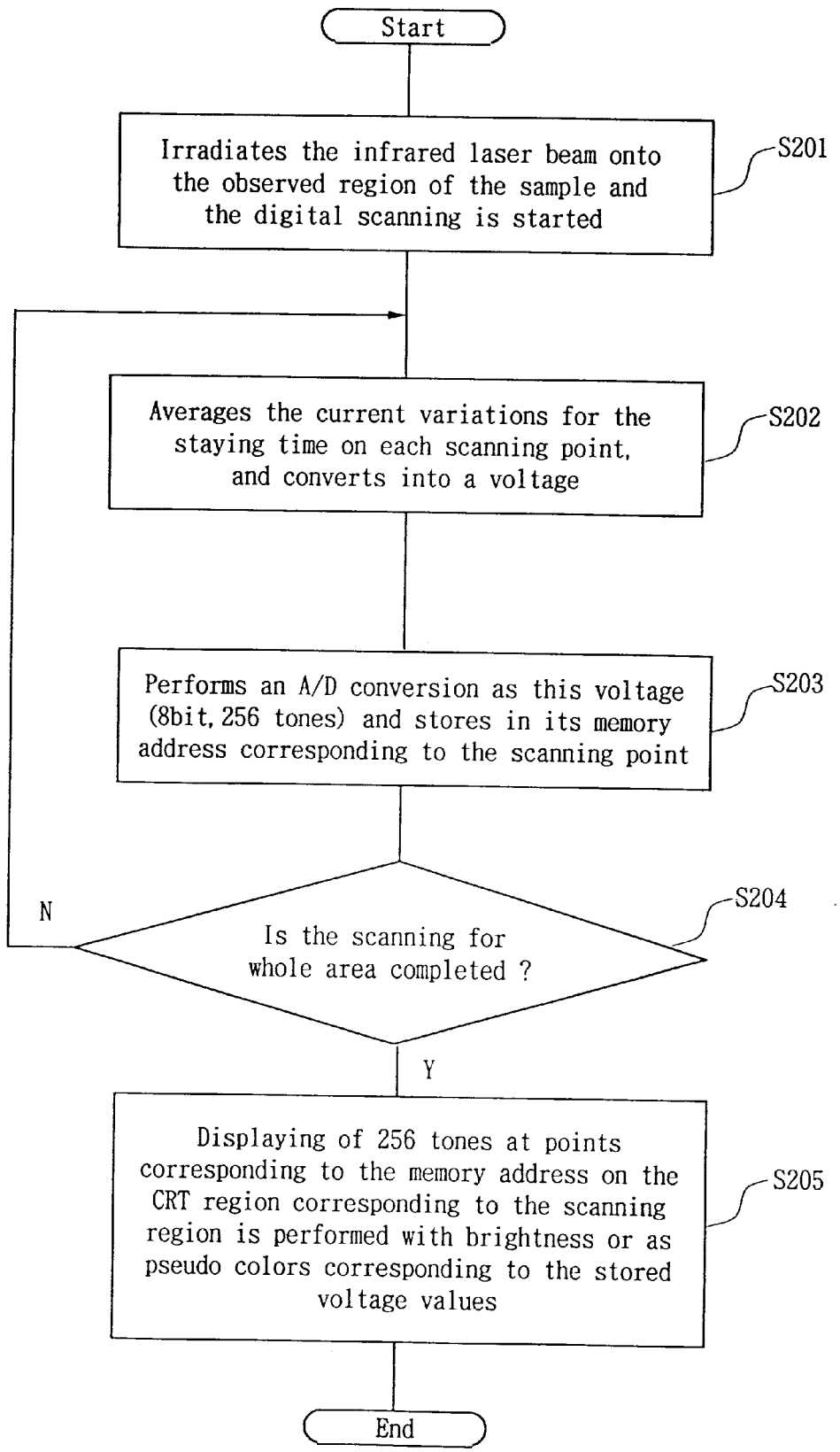
FIG. 7 is a flow chart showing process operations for acquiring a current image or a defect image in the first embodiment.

FIG. 7 shows a flow chart of process operations for obtaining the current image and the defect image. Total control of these processing operations is carried out by the CPU installed in the system control/signal processing section 27. The CPU irradiates the infrared laser beam 11 emitted from the infrared laser beam source 23 onto the observed region of the integrated circuit 12 via the microscope body 24 and the objective lens 25, and the digital scanning is started (Step S201). Staying time at each scanning point is set at 2 $\mu$S.

At this state, the current variation inspection section 17 averages the current variations for the staying time on each scanning point and converts the averaged current variation value to a voltage (Step S202). The system control/signal processing section 27 performs an A/D conversion as this voltage and makes the foregoing memory section store the A/D converted voltage in its memory address corresponding to the scanning point (Step S203). In this embodiment, the voltage is subjected to the A/D conversion so that the voltage is converted to the digital signals of 8 bit, namely 256 tones. Then, the digital signals are stored. Such processings of Step S202 and S203 are repeated until scanning for the whole area of the observed region are completed (Step S204). When the scanning for the whole area of the observed region is completed (Y), the irradiation of the infrared laser beam 11 is finished. At the same time, displaying of 256 tones at points corresponding to the memory address on the CRT region corresponding to the scanning region is performed with brightness corresponding to the stored voltage values (Step S205). Instead of such displaying according to the brightness, the displaying according to pseudo colors may be performed by making the stored voltage correspond to respective colors.

As described above, at the acquisition of the current image and the defective image, the scanning on the observed region of the integrated circuit 12 as a sample is performed digitally with the irradiation of the infrared laser beam 11 (Step S201). Described concretely, the scanning for 262,144 points in total, composed of 512 points in a lateral direction and 512 points in a longitudinal direction, is performed. The staying time at each point is 2 $\mu$S, and one scanning period is about 0.5 seconds.

Figure 8:
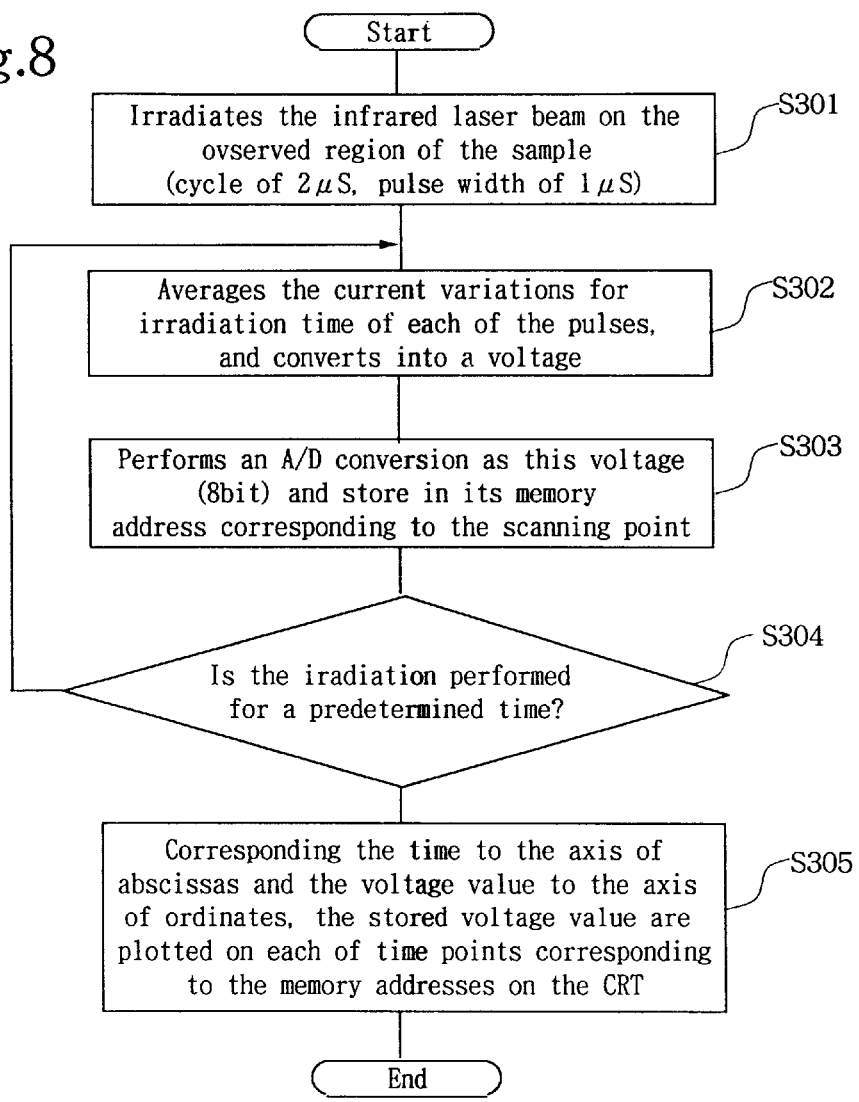
FIG. 8 is a flow chart showing process operations for acquiring a current waveform in the first embodiment.

FIG. 8 shows process operations at the acquisition of the current waveform. When the current waveform is acquired, the infrared laser beam 11 is made into a pulse-shaped beam having a cycle of 2 $\mu$S and a pulse width of 1 $\mu$S, and the irradiation of the beam onto the observed region of the integrated circuit 12 is begun (Step S301). In the current variation inspection section 17, the current variations for irradiation time of each of the pulses are averaged, and the averaged current variation is converted into the voltage (Step S302). The system control/signal processing section 27 performs an A/D conversion for this voltage, and stores it in the memory address of the foregoing memory section corresponding to this time (Step S303). In this embodiment, the voltage is subjected to the A/D conversion at 8 bits. Until the irradiation of the infrared laser beam 11 for the integrated circuit 12 is performed for a predetermined time (Step S304; N), the processing operations of Steps S302 and S303 are performed repeatedly.

When the predetermined time has passed (Step S304; Y), the irradiation of the infrared laser beam 11 is finished. At the same time, corresponding the time to the axis of abscissas and the voltage value to the axis of ordinates, the stored voltage values are plotted on each of time points corresponding to the memory addresses on the CRT as the image/waveform display section 28 (Step S305). When the axis of ordinates is changed for the current value, the current waveform is obtained. At this time, in order to acquire a higher time resolution, the pulse width and cycle of the infrared laser beam 11 will be shortened.

Even when a sufficient S/N, a ratio of a signal to a noise, can not be obtained by the irradiation performed once, in case where the current to be measured is cyclic, it will suffice that under the conditions that the processing from the Step S302 to S304 in FIG. 8 are synchronized with the cycle of the current, the voltages stored in the foregoing memory section are added up and then are averaged. Thus, it will be possible to improve the S/N ratio.

Subsequently, the description about the inspection of the integrated circuit 12 of the first embodiment will be made. In case where the wiring system on the chip of the integrated circuit 12 is to be inspected, the sample stage 21 is moved such that the observed region of the integrated circuit 12 is disposed at a position where the irradiation of the infrared laser beam will be possible. Then, electric power is supplied from the constant voltage source 15 to the integrated circuit 12. The prescribed test-pattern is generated from the test-pattern generating section 26 to set the integrated circuit 12 at a prescribed state. The integrated circuit 12 is set at the prescribed state.

In this state, the infrared laser beam 11 is irradiated onto the observed region, and the observed region is scanned digitally (Step S201 in FIG. 7). Thereafter, as described above, the processings are carried out according to the Steps S202 to S205 of FIG. 7, so that the current image and the defect image can be obtained. After the observation of the current image or the defect image, when the current waveform at a prescribed time is wanted to obtain, the current waveform will be obtained by performing the processings according to the Steps S301 to S305 in FIG. 8.

(Second Embodiment)

Figure 9:
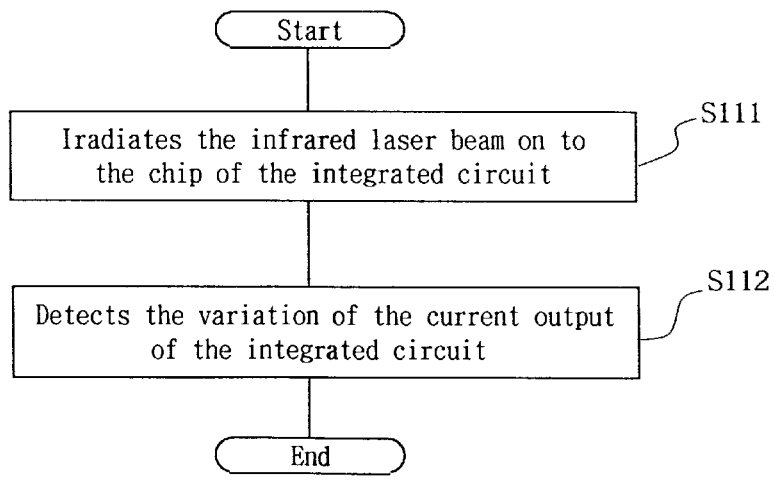
FIG. 9 is a flow chart showing a principle of a inspection method for a semiconductor device performed in a inspection apparatus for a semiconductor device of a second embodiment of the present invention.

FIG. 9 shows a principle of an inspection method of a semiconductor device performed for an inspection apparatus of a semiconductor device of a second embodiment of the present invention. This method corresponds to the case where a bias is zero in the IR OBIRCH-BVI method. This method is expressed as an IR OBIRCH-NBI, which means the method for detecting a current in the case when the bias is zero. In the inspection method of the second embodiment, the infrared laser beam is irradiated onto the chip of the integrated circuit (Step S111), and the variation of the current output from the ground terminal of the integrated circuit is detected (Step S112). The inspection of the current variation may be performed with the power source terminal or the signal terminal instead of the ground terminal. Furthermore, the terminals other than the one to detect the current may be grounded or opened. The number of the above combinations is enormous. In this embodiment, two examples to detect the current variation output from the ground terminal are shown below.

Figure 10:
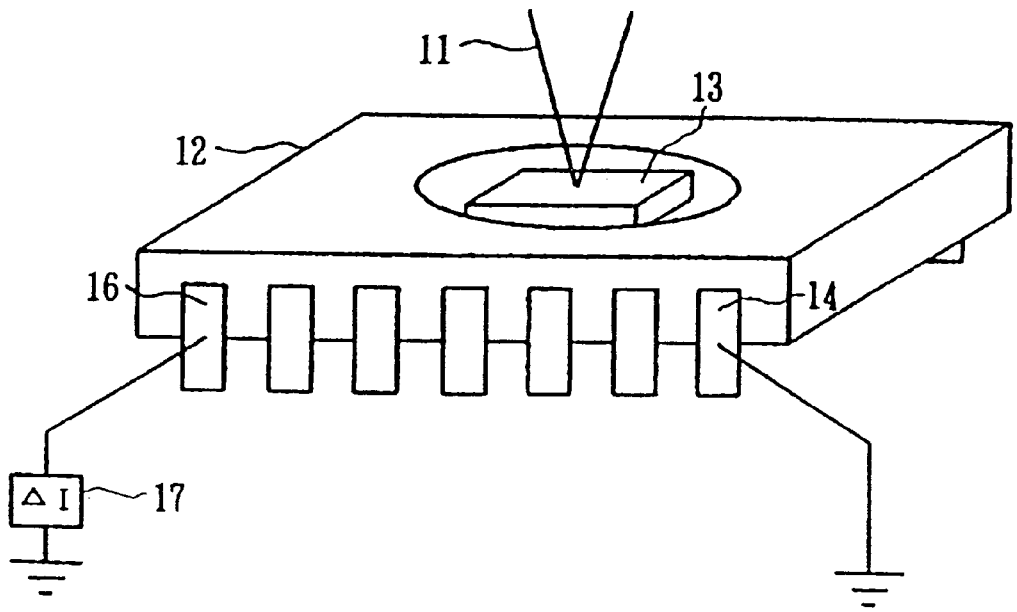
FIG. 10 is a schematic perspective view illustrating an example of a constitution of the inspection apparatus for the semiconductor device of the second embodiment, wherein a power source terminal is grounded.

FIG. 10 shows an example of a constitution of the inspection apparatus of the semiconductor device of the second embodiment, in which the electric power source terminal is grounded. The same reference numerals are given to the same portions as those of the first embodiment shown in FIG. 5, and the explanations for them are properly omitted. By heat processing which utilizes the irradiation of the infrared laser beam, thermoelectric power of the irradiated portion is generated and a potential difference is generated so that the current variation $\Delta I$ is detected.

Figure 11:
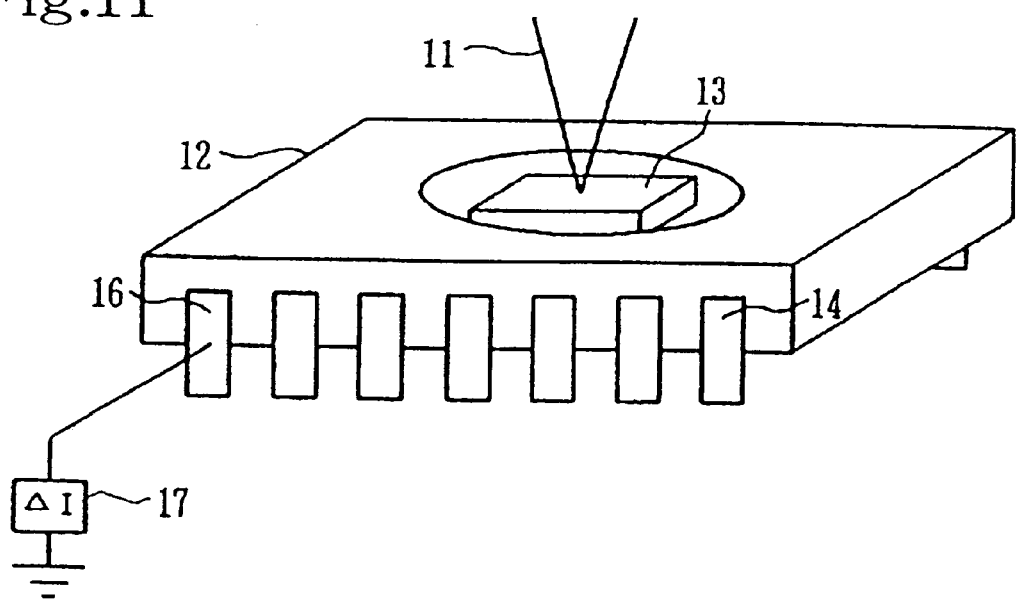
FIG. 11 is a schematic perspective view illustrating another example of a constitution of the inspection apparatus for the semiconductor device of the second embodiment, wherein the power source terminal is opened.

FIG. 11 shows another example of the constitution of the inspection apparatus of the semiconductor device of the second embodiment, in which the electric power source terminal is opened. The same reference numerals are given to the same portions as those in FIG. 10, and the explanations for them are properly omitted. Also in this case, by heating utilizing the irradiation of the infrared laser beam, thermoelectric power is generated in the irradiated portion, and the potential difference is generated so that the current variation $\Delta I$ is detected. Since the generation of the current is transient, it is possible to detect the current variation $\Delta I$, even when the electric power source terminal is opened as shown in FIG. 11.

Although a mechanism of the generation of the current by the thermoelectric power is not made clear precisely, there are two interpretations for it at present. One interpretation is that since the thermoelectric power at the portion where the defects exist is different from that of the portion where no defects exist, the current is generated so that the defects can be detected. The other interpretation is that since the thermal conductivity varies among the portions where the defects exist and not exist, the temperature gradient is produced so that the current due to the thermoelectric power is generated.

Figure 12:
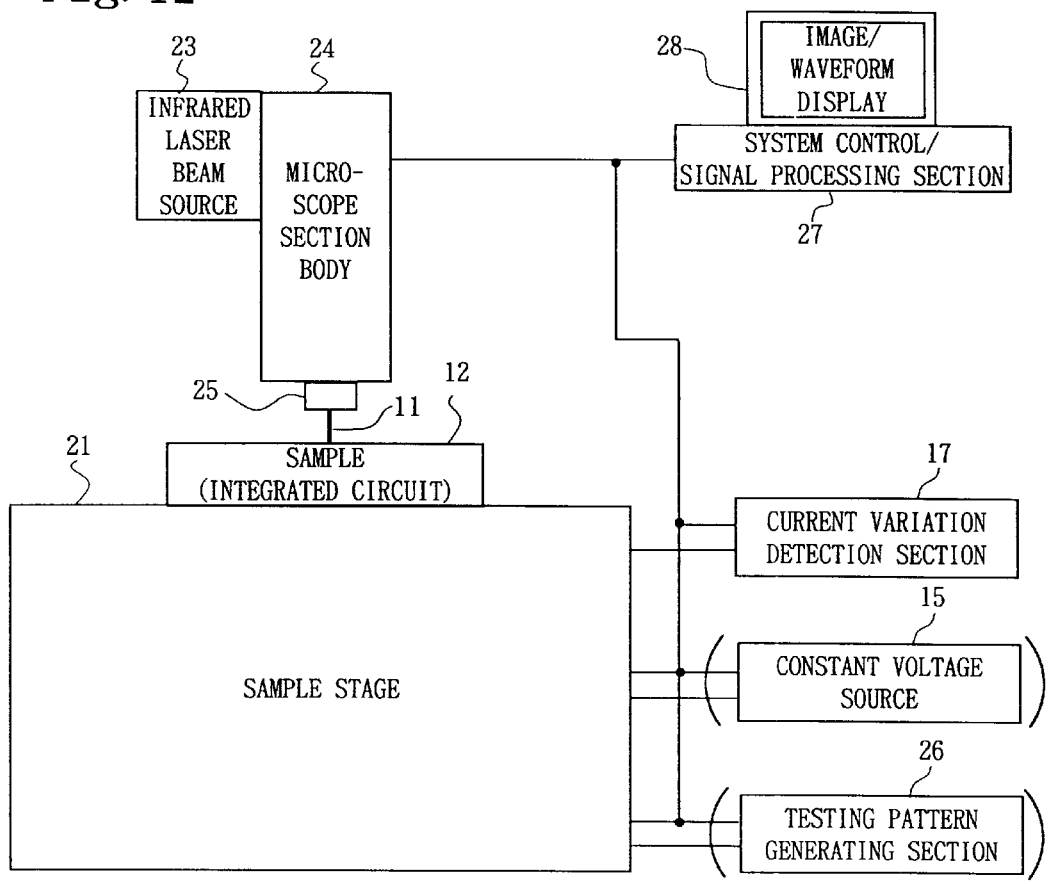
FIG. 12 is a block diagram illustrating a inspection apparatus for a semiconductor device, i.e. a wiring system defect detection apparatus, of the second embodiment.

FIG. 12 shows the inspection apparatus of the semiconductor device of the second embodiment, namely, the constitution of the defect inspection apparatus for the wiring system. The same reference numerals are given to the same portions as those of the first embodiment in FIG. 6, and explanations for them are properly omitted. In the inspection apparatus of the second embodiment, the constant voltage source section 15 and the test-pattern generating section 26 are given in parentheses. The reason for this is to show that there are two cases, depending on the presence of the sections 15 and 26.

(1) The case where the constant voltage source section 15 and the test-pattern generating section 26 are not present:

In this case, the observation according to the principle shown in FIG. 10 or FIG. 11 can be done, regardless of the position irradiated by the infrared laser beam 11.

(2) The case where the constant voltage source section 15 and the test-pattern generating section 26 are present:

In this case, the constitution of the inspection apparatus is the same as that of the first embodiment shown in FIG. 6. Specifically, in the event that a sufficient current flows through the wiring containing the portion irradiated by the infrared laser beam 11, the observation according to the principle shown in FIG. 5 takes place. This is the same as the first ebodiment. On the contrary, in the event that a sufficient current does not flow though the wiring containing the portion irradiated by the infrared laser beam 11, the observation according to the principle explained before using FIG. 10 or FIG. 11 takes place.

In case of the second embodiment, the observation of the current image and the waveform is not possible, but the defect image can be observed. However, it is possible to observe the portion where no current flows, in this point, the inspection method of the second embodiment has the advantage of the wider applicable cases over the defect inspection method by the first embodiment and the IR OBIRCH (the inspection apparatus of the mutual wiring in the semiconductor integrated circuit, disclosed in Japan Patent Laid Open No. 7-167,924). It is shown experimentally that in the case of the observation of the defect, a inspection sensitivity and spatial resolution for the defect in the defect observation according to the IR OBIRCH is superior to those in the inspection apparatus of the second embodiment and the inspection method thereof. Consequently, it is necessary to use both methods and apparatuses of the first and second embodiments selectively utilizing the advantages of both inspection apparatuses and methods of the first and second embodiments. The flow of the processings for acquiring the defect image is the same as that of the first embodiment shown in FIG. 7. An illustration and a description for the flow of this embodiment are omitted.

(Third Embodiment)

Figure 13:
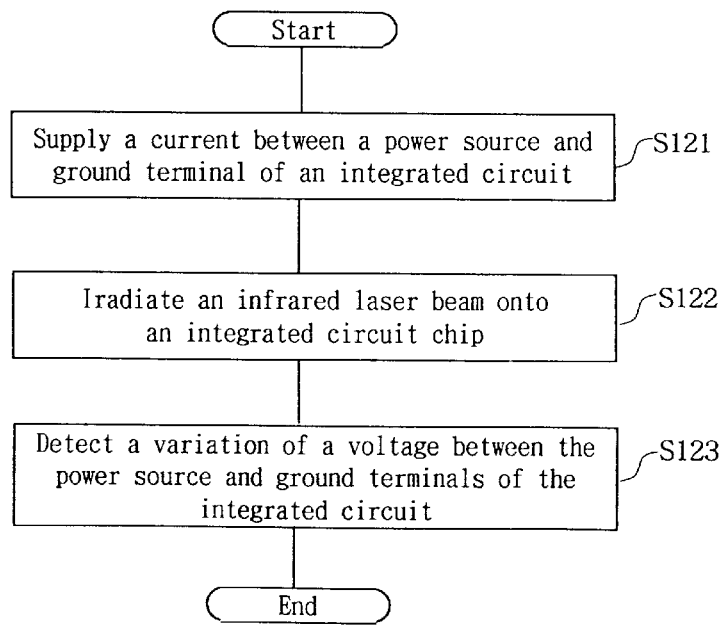
FIG. 13 is a flow chart showing a principle of a inspection method for a semiconductor device performed in an inspection apparatus for a semiconductor device of a third embodiment of the present invention.

FIG. 13 shows a principle of an inspection method of a semiconductor device of a third embodiment according to the present invention. In this embodiment, a current is applied whereby a voltage variation is detected. This inspection method of the third embodiment shall be expressed as an IR OBIRCH-BIV, where BIV means a current application/a voltage inspection method among the Bias application methods. In the third embodiment, a current is supplied between a power source and ground terminal of an integrated circuit (Step S121). Infrared laser beam is irradiated onto a chip of the integrated circuit (Step S122). A variation of a voltage between the power source and ground terminal of the integrated circuit is detected (Step S123).

Figure 14:
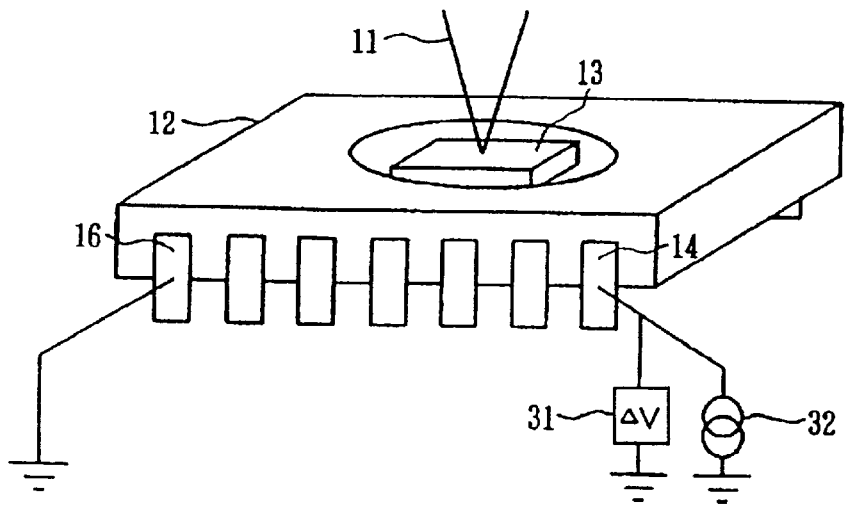
FIG. 14 is a schematic perspective view illustrating an example of a constitution of the inspection apparatus for the semiconductor device of the third embodiment.

FIG. 14 shows an example of a constitution of a inspection apparatus of a semiconductor device of the third embodiment. The same reference numerals are given to the same portion as those of the first embodiment shown in FIG. 5. Explanations for them are properly omitted. The ground terminal 16 of the inspection apparatus is grounded. The power source terminal 14 is connected to a voltage variation inspection section 31 and the constant current source 32, other terminals of which are grounded. In this embodiment, the variation in the voltage between the power source terminal 14 and the ground terminal 16 of the integrated circuit 12 shall be detected by the voltage variation inspection section 31. The voltage variation may be detected between the terminal other than the power source and ground terminals. However, since the variation of the whole of the integrated circuit chip 13 is reflected between the power source terminal 14 and the ground terminal 16, the variation is detected most suitably between the power source terminal 14 and the ground terminal 16. When the voltage variation is detected, the observation can be done at the prescribed state of the integrated circuit 12 by inputting the test-pattern from the input terminal to the integrated circuit 12 to set it at the prescribed state.

The voltage variation in the case of the IR OBIRCH-BIV can be expressed by the following formula (3).

$$\Delta V = \Delta R \cdot I \quad (3)$$

where $\Delta V$ is a voltage variation induced by the irradiation of the beam, and $\Delta R$ is a resistance variation induced by the irradiation of the beam. If there are defects such as voids, the resistance variation $\Delta R$ increases. A symbol I denotes a current flowing through the wiring irradiated by the beam.

As is understood from the formula (3), even in the inspection apparatus of the semiconductor device of the third embodiment, the observation of not only the defects such as the voids but also the current flowing through the wiring irradiated by the beam can be performed.

Figure 15:
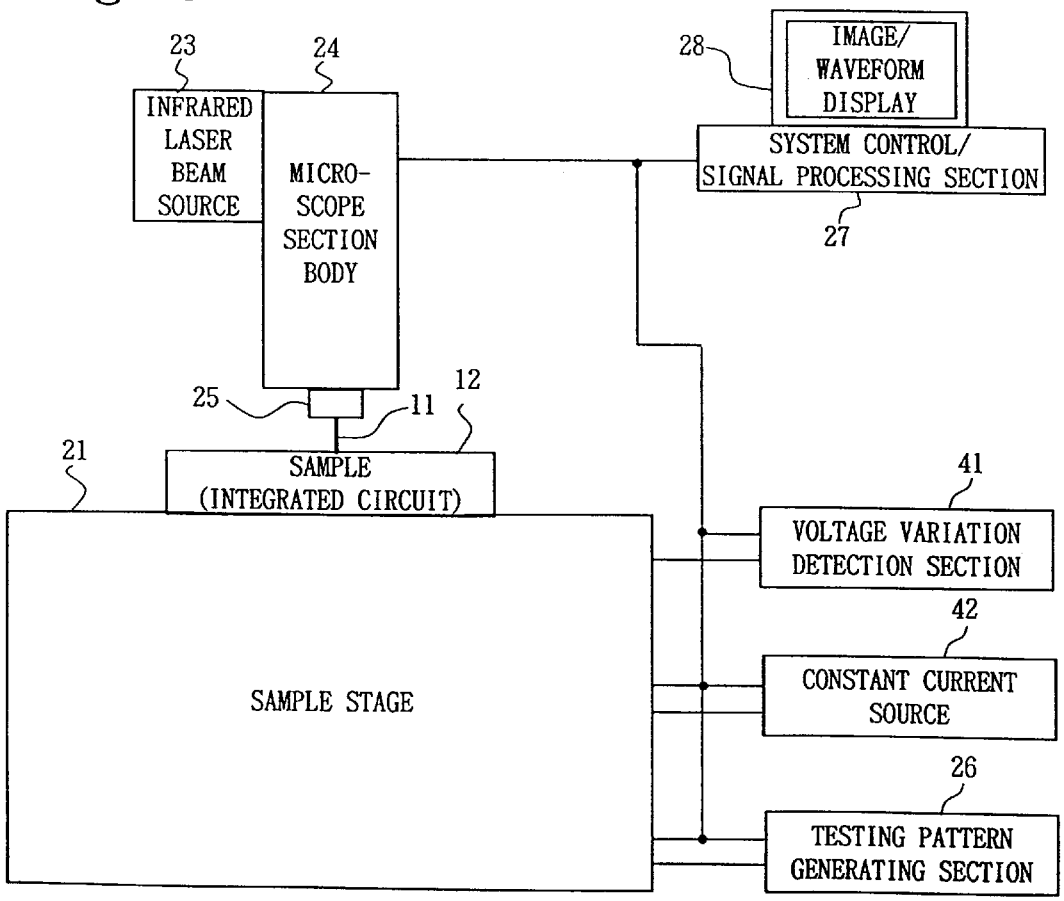
FIG. 15 is a block diagram illustrating a inspection apparatus for the semiconductor device, i.e. a wiring system inspection apparatus, in the third embodiment.

FIG. 15 shows a constitution of the inspection apparatus of the semiconductor device of the third embodiment, namely, a constitution of a wiring system inspection apparatus. The same reference numerals are given to the same portions as those of the first embodiment shown in FIG. 6. Explanations for them are properly omitted. When the inspection apparatus of the semiconductor device of the third embodiment is compared to that of the first embodiment, the current variation inspection section 17 in FIG. 6 is replaced by the voltage variation inspection section 41 and the constant voltage source 15 in FIG. 6 is replaced by the constant current source 42. Since the inspection of the voltage variation is easier than that of the current variation, in this point, the apparatus of the third embodiment has the advantage over that of the first embodiment.

(Fourth Embodiment)

Figure 16:
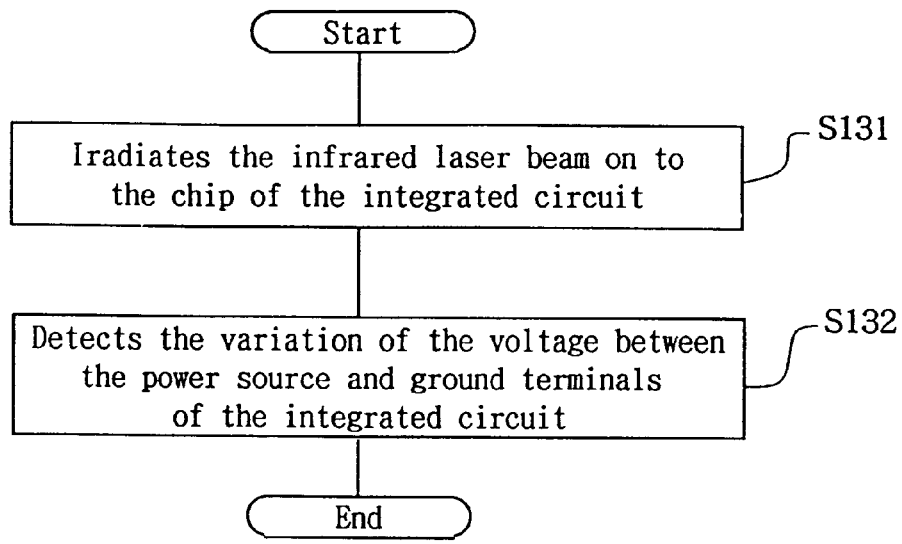
FIG. 16 is a flow chart showing a principle of an inspection method for a semiconductor device performed in an inspection apparatus for a semiconductor device of a fourth embodiment of the present invention.

FIG. 16 shows a principle of an inspection method of a semiconductor device performed in an inspection apparatus of a semiconductor device of a fourth embodiment of the present invention. The inspection method of the fourth embodiment corresponds to the IR OBIRCH-BIV, at the time when a bias is zero. The inspection method of the fourth embodiment shall be expressed as an IR OBIRCH-NBV, which is a method to detect a voltage at Non-Bias state. In the fourth embodiment, the infrared laser beam is irradiated onto the chip of the integrated circuit (Step S131), and the variation of a voltage between the power source terminal and ground terminal of the integrated circuit is detected (Step S132).

It is not always necessary to detect the voltage variation between the power source terminal and the ground terminal, instead the voltage variation between terminals other than the power source and ground terminals may be detected. Since the variation of the whole of the integrated circuit chip influences the variation between the power source terminal and the ground terminal, the voltage variation is detected most suitably between the power source terminal and the ground terminal. The terminals other than those to detect the voltage variation may be grounded or opened. The number of the above combinations is enormous, however, in the fourth embodiment, the following two examples will be described.

Figure 17:
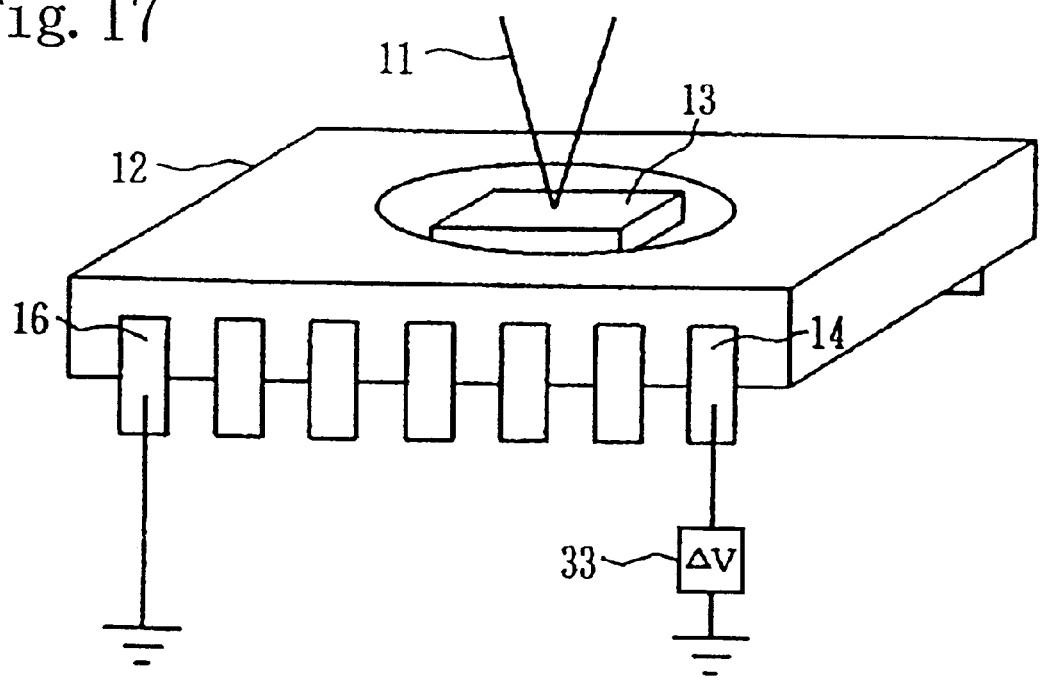
FIG. 17 is a schematic perspective view illustrating an example of a constitution of the inspection apparatus for the semiconductor device of the fourth embodiment, wherein a ground terminal is grounded.

FIG. 17 shows an example of a constitution of the inspection apparatus of the semiconductor device of the fourth embodiment, in which the ground terminal is grounded. The same reference numerals are given to the same portions as those of the first embodiment in FIG. 5, and explanations for them are omitted. The ground terminal 16 is grounded, and the power source terminal 14 is connected to the voltage variation inspection section 33, one terminal of which is grounded. By heating utilizing the irradiation of the infrared laser beam, thermoelectric power is generated in the irradiated portion, so that a potential difference appears. The voltage variation inspection section 33 detects the voltage variation $\Delta V$.

Figure 18:
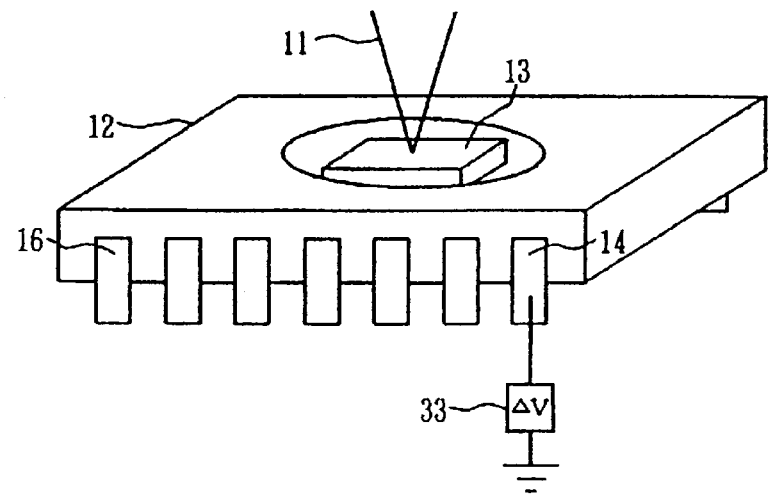
FIG. 18 is a schematic perspective view illustrating another example of a constitution of the inspection apparatus for the semiconductor device of the fourth embodiment, wherein the ground terminal is opened.

FIG. 18 shows another example of a constitution of the inspection apparatus of the semiconductor device of the fourth embodiment, in which the ground terminal 16 is opened. The same reference numerals are given to the same portions as those of FIG. 17, and explanations for them are properly omitted. In the inspection apparatuses in FIGS. 17 and 18, the difference of the thermoelectric power due to the presence of the defects enables to detect the defects. Specifically, it is impossible to observe the current image and the current waveform, but it is possible to observe the defect image.

Figure 19:
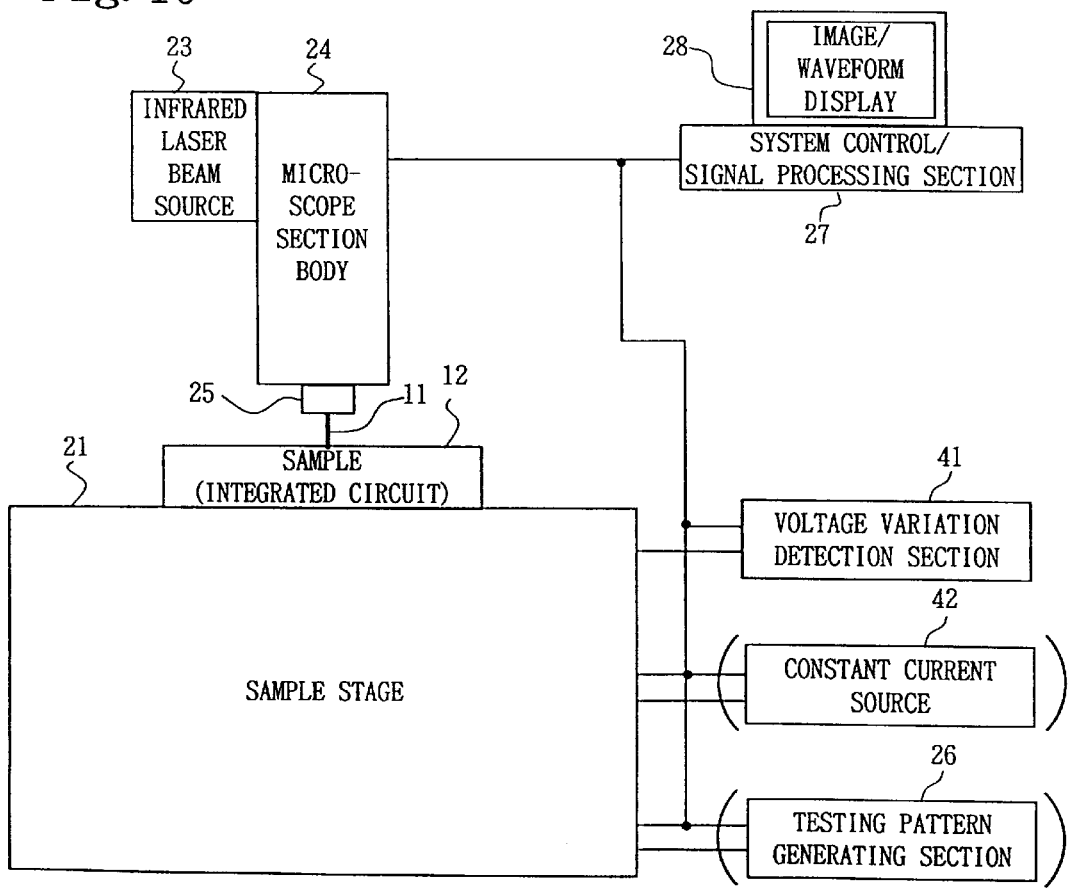
FIG. 19 is a block diagram illustrating a constitution of an inspection apparatus for the semiconductor device, i.e. a wiring system defect detection apparatus, of the fourth embodiment.

FIG. 19 shows a constitution of the inspection apparatus of the semiconductor device of the fourth embodiment, namely, a wiring system defect detection apparatus. The same reference numerals are given to the same portions as those of the third embodiment in FIG. 15, and explanations for them are properly omitted. In the inspection apparatus of the fourth embodiment, the constant current source 42 and the test-pattern generating section 26 are given with parentheses to show that there are two cases, one being the case where sections 42 and 26 are present, and the other, not present.

(1) The case where the constant voltage source section 15 and the test-pattern generating section 26 are not present:

In this case, the observation according to the principle explained using FIG. 17 or FIG. 18 is possible regardless of the position irradiated by the infrared laser beam 11.

(2) The case where the constant voltage source section 15 and the test-pattern generating section 26 are present:

In this case, a constitution of the inspection apparatus is the same as that of the third embodiment shown in FIG. 15. Specifically, when a sufficient current flows through the wiring having the portion irradiated by the infrared laser beam 11, an observation will be done according to the principle explained using FIG. 14. This is the same as the third embodiment. Contrary to this, when a sufficient current does not flow through the wiring having the portion irradiated by the infrared laser beam 11, an observation according to the principle explained using FIG. 17 or FIG. 18 will be done.

Specifically, in the case of the fourth embodiment, it is impossible to observe the current image and the current waveform as described in FIG. 18, simply except for the defect image. However, since the inspection of the voltage variation is easier to perform than that of the current variation, the fourth embodiment is also effective.

(Fifth Embodiment)

Figure 20:
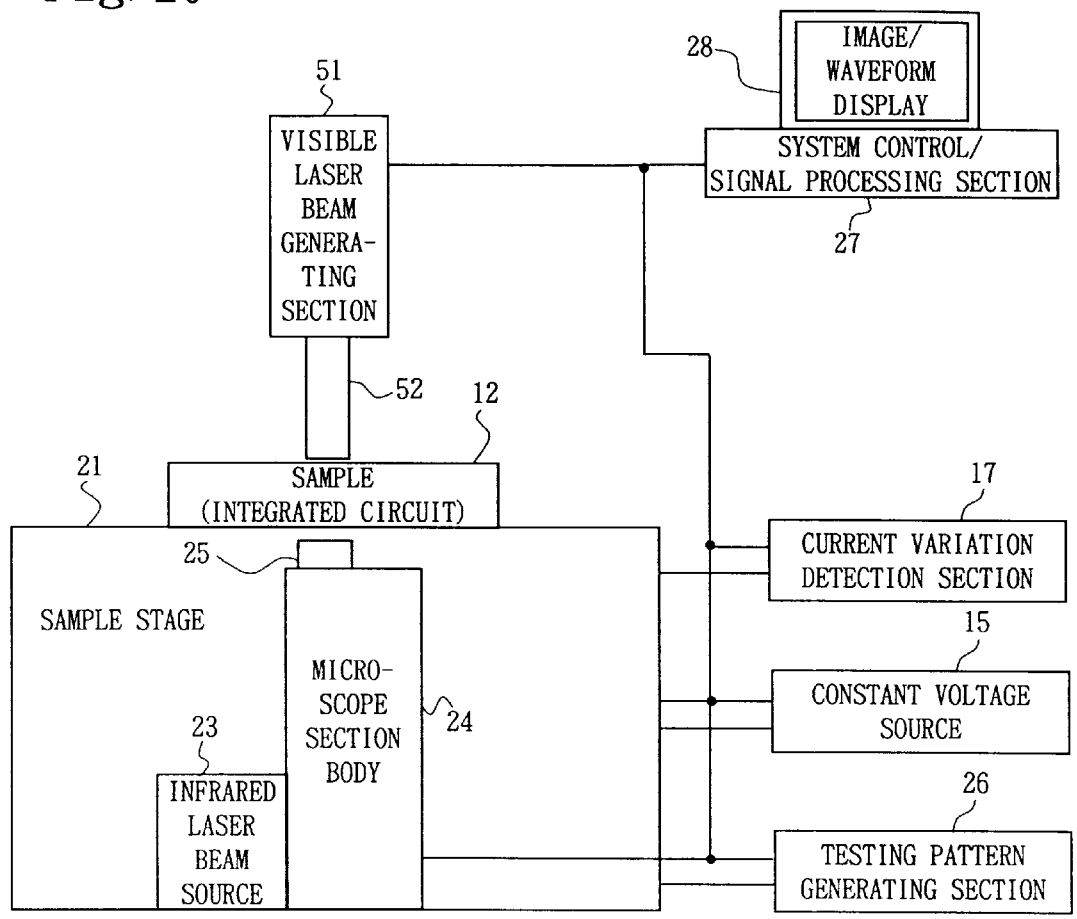
FIG. 20 is a block diagram illustrating a constitution of an inspection apparatus for a semiconductor device of a fifth embodiment of the present invention.

FIG. 20 illustrates a constitution the inspection apparatus of the semiconductor device of the fifth embodiment of the present invention. The same reference numerals are given to the same portions of FIG. 20 as those of FIG. 6, and explanations for them are properly omitted. In the fifth embodiment, the infrared laser beam source 23, the microscope section body 24, and the objective lens 25 are arranged upside down for the first to fourth embodiments under the sample stage 21 mounting the integrated circuit 12 as a sample. The reason for this is to make the observation from the rear surface of the integrated circuit 12 possible. Furthermore, the visible laser beam generating section 51 and the microscope section 52 are arranged above the integrated circuit 12, so that the observation of the integrated circuit 12 from its upper surface is possible without turning it upside down. The constant voltage source 15, the current variation inspection section 17, and the test-pattern generating section 26 are connected to the parts such as the microscope body 24 via the sample stage 21, likewise the inspection apparatus of FIG. 6. The visible laser beam generating section 51 is connected to the system control/signal processing section 27, and the image or the waveform is displayed on the CRT as the image/waveform display section 28 based on the processed signal.

Figure 21:
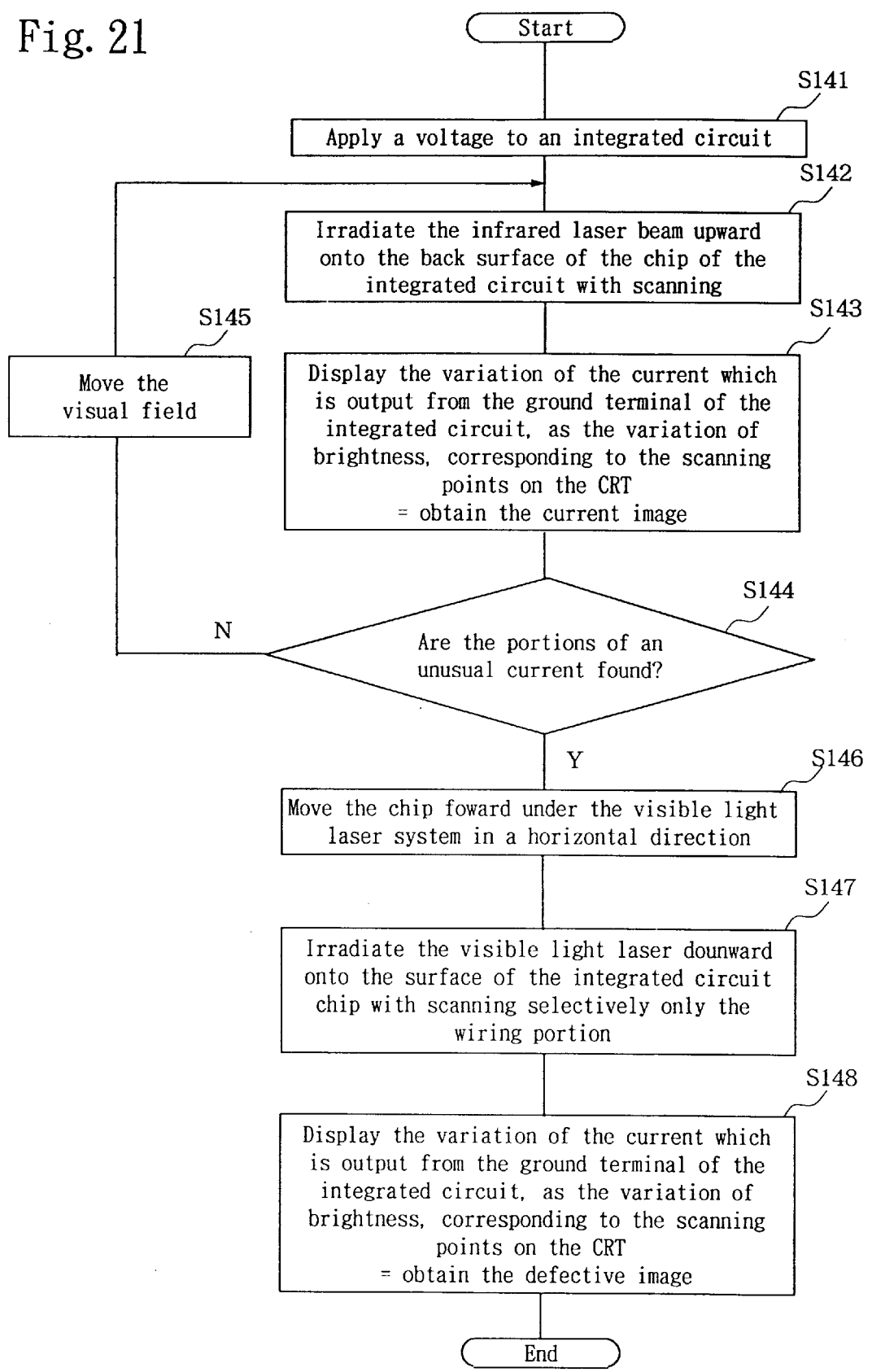
FIG. 21 is a flow chart illustrating process operations performed in the inspection apparatus for the semiconductor device of the fifth embodiment.

FIG. 21 shows a flow chart of the processing operations performed in the inspection apparatus of the semiconductor device of the fifth embodiment. First, likewise other foregoing embodiments, a voltage is applied to the integrated circuit 12 (Step S141). It is a matter of course that the integrated circuit 12 used as a sample in this embodiment has a chip with an exposed surface. It is necessary that the back surface of the chip of the integrated circuit 12 be exposed and mirror-polished.

Subsequently, the back surface of the chip of the integrated circuit 12 is scanned during the irradiation of the infrared laser beam onto it (Step S142). Then, the variation of the current which is output from the ground terminal of the integrated circuit 12 is displayed as the variation of brightness, which is made to correspond to the scanning points, on the foregoing CRT (Step S143). Specifically, the current image according to the OBIRCH method is fetched. If an area as wide as possible on the integrated circuit chip 13 (see FIG. 5) is scanned with the laser beam when the current image is fetched, the detection of the failure portions is made easier. This is explained concerning $I_{DDQ}$ failure as an example.

The $I_{DDQ}$ failure is one of failure modes of a CMOS LSI as the integrated circuit 12, in which a power source current is large compared to a normal one at a quiescent state. When, in the ORBIRCH method, a current more than several $\mu A$ flows due to the $I_{DDQ}$ failure, the current path can be observed as a current image, because of inspection sensitivity of several $\mu A$. Consequently, in such case, it is possible easily to detect where the current path is on the integrated circuit chip 13. For example, in case that the area of the integrated circuit chip 13 is 10 mm square, the inspection is performed with a visual field of 5 mm square, it is possible to find the failure current path by observing the 4 areas in the worst case.

As a way to prevent an obstacle to OBIRCH signals, it is possible to irradiate selectively the visible laser beam only onto the wiring portion as disclosed in Japanese Patent Application No. 7-025758, filed on Feb. 15, 1995. However, it is very difficult to obtain the current image at a wide visual field using a selective scanning method. When observing the visual field of, for example, 2 mm square, an area occupied by one pixel is as large as 4 $\mu m \times 4$ $\mu m$ in the scanning of 512×512 pixels used in an ordinary digital scanning. Consequently, it is impossible to irradiate the laser beam only on the wiring portion of 1 $\mu m$ width so that OBIC signals are generated.

In the event that judgment whether the current value is unusual or not is not always so simple as the $I_{DDQ}$ failure, a method of comparing with an acceptable product is easiest. At this time, by moving the sample stage 21, the positions where the acceptable product and the defective product are present are alternatively observed. In the event that the current image is complicated, if the difference between the current images of the acceptable product and the defective product is obtained, it is possible to discriminate easily the portion of the different current path. As a way to obtain the difference of the current image, it is in general most popular to use the difference of the value of the brightness of every pixel of the original image as the value of the brightness of every pixel of the difference image. Moreover, it is most simple, too.

Returning to FIG. 21, a description will be made. If the defective portion of the current can not be found as described in the above manner (Step S144; N), the visual field is moved, and the processings from the Step S142 are repeated. When the portion of a unusual current is found (Step S144; Y), the step is advanced to the processing to observe the defective image near that portion containing the defect. At this time, the defective image can be observed with a higher sensitivity according to the OBIRCH or NB-OBIC method using the visible light laser, than according to the OBIRCH and NB-OBIC method using the infrared laser. The reason is for the difference of the wavelengths. The wavelength of the laser infrared beam is, for example, 1.3 µm, and the wavelength of the visible laser beam is, for example, 633 nm. The difference approximately twice the wavelength appears directly as the difference of the radius of the laser beam, and appears as the difference of the defect inspection sensitivity at the time of the defect inspection.

Therefore, in the fifth embodiment, the visible light laser is used on the observation of the defect image. For change to the visible light laser, the integrated circuit chip 13, for example, shown in FIG. 5, is made to move toward under the visible light laser system in a horizontal direction (Step S146). Otherwise, if the visible laser beam and the infrared laser beam are arranged on the same line, this positioning operation is not needed. Then, the visible light laser is irradiated downward onto the surface of the integrated circuit chip 13 (Step S147). When the OBIRCH method or the NB-OBIC method is executed using the visible light laser, the OBIC signal disturbs the execution as described above. So prevent the disturbance by the OBIC signal, the selective scanning method is effective when the scanning area is comparatively small as in the case of obtaining the defective image. The selective scanning method is one for irradiating selectively only the wiring portion, as recited in the specification of Japan Patent Application No. 7-025,758, filed on Feb. 15, 1995. In this method, the wiring portion alone is irradiated during scanning selectively. Therefore, the OBIC current is not generated. By this irradiation, the variation of the current output from the ground terminal of the integrated circuit 12 is made to correspond to the scanning point as the variation of brightness, and is displayed on the foregoing CRT (Step S148). According to these processings, it will be possible to obtain the defective image by obtaining the OBIRCH image or the NB-OBIC image using the selective scanning method.

(Sixth Embodiment)

Figure 22:
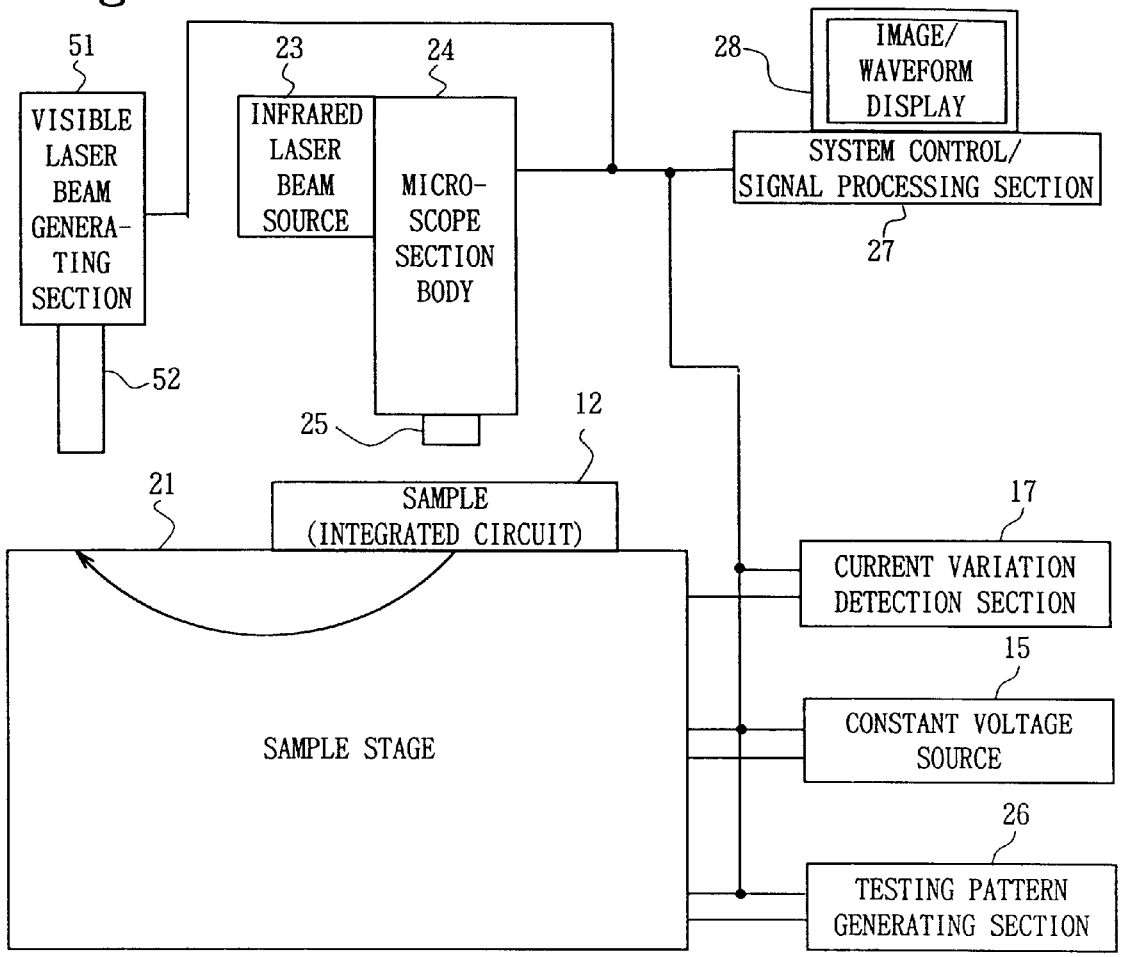
FIG. 22 is a block diagram illustrating a constitution of a inspection apparatus for a semiconductor device of a sixth embodiment of the present invention.

FIG. 22 shows a constitution of a inspection apparatus of a semiconductor device of a sixth embodiment of the present invention. The same reference numerals are given to the same portions as those of FIG. 20, and explanations for them are properly omitted. In the sixth embodiment, the visible laser beam generating section 51, the microscope section 52, the infrared laser beam source 23, the microscope section body 24, and the objective lens 25 are arranged above the sample stage 21 mounting the integrated circuit 12 as a sample, the infrared laser beam source 23, the microscope section 24, and the objective lens 25 being apart from the visible laser beam generating section 51 and the microscope section 52 through a predetermined interval.

Operations of the inspection apparatus of the semiconductor device shown in FIG. 22 will be described below. The inspection apparatus of the sixth embodiment is principally the same as that of the fifth embodiment, except the irradiation direction of the infrared laser beam and the movement manner of the integrated circuit chip 13 shown in FIG. 5 at the time of switching the observation method. Specifically, in the inspection apparatus of the sixth embodiment, the infrared laser beam source 23, the microscope section body 24, and the objective lens 25, which constitutes the infrared beam microscope section, are arranged above the sample stage 21. Arrangement of them are obtained by turning upside down the arrangement of FIG. 20. It is necessary to rearrange the integrated circuit 12 as a sample so that it is turned inside out between the position just below the objective lens 25 and the position just below the microscope section 52.

Figure 23:
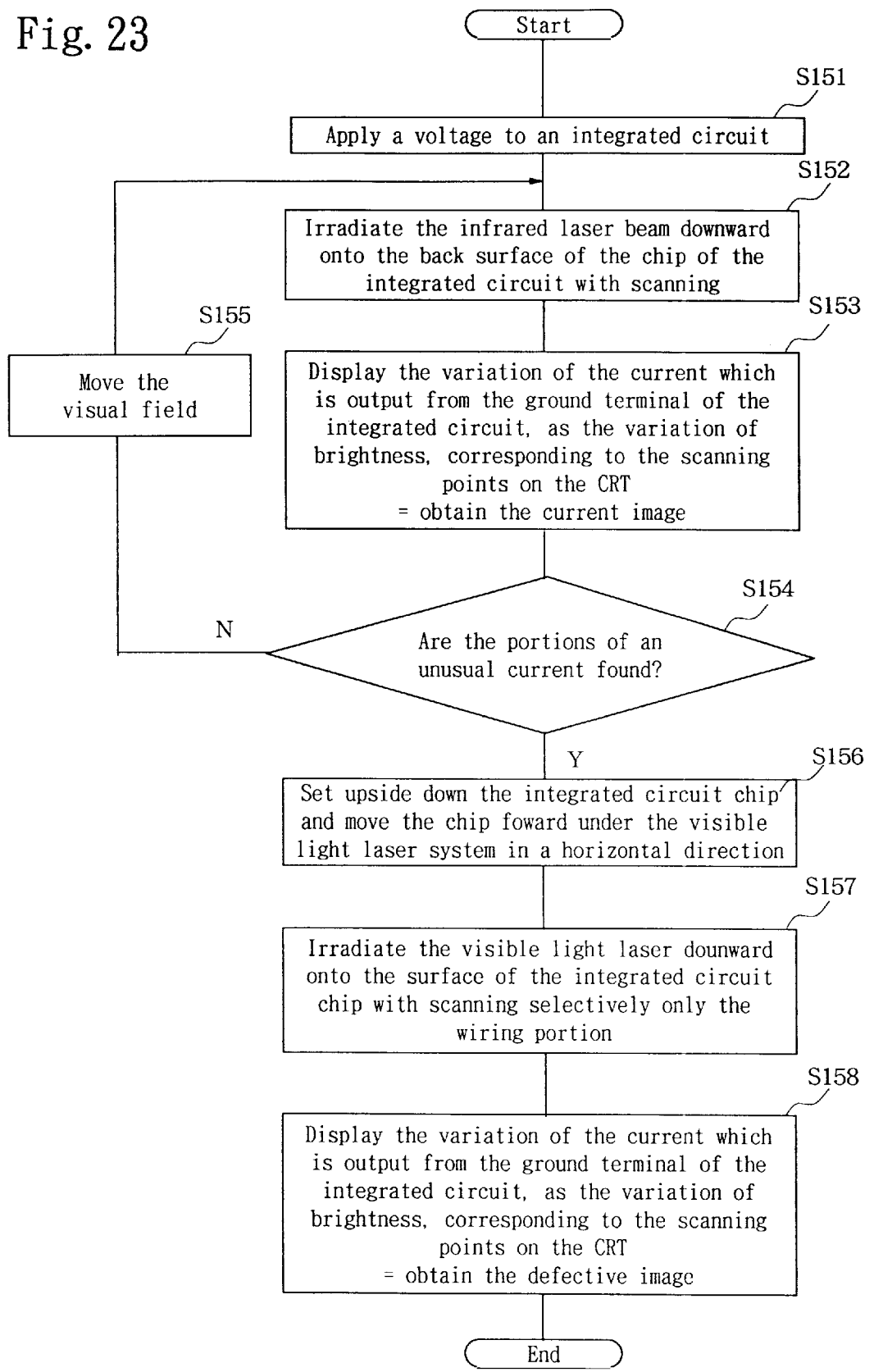
FIG. 23 is a flow chart illustrating process operations performed in the inspection apparatus for the semiconductor device of the sixth embodiment.

FIG. 23 shows a flow chart of the processing operations of the inspection apparatus of the semiconductor device of the sixth embodiment. The flow chart of the processing operations of the inspection apparatus of the sixth embodiment in FIG. 23 is principally the same as that of the fifth embodiment, and the different points from the fifth embodiment will be described. In the step S152, the infrared beam is irradiated downward onto the back surface of the integrated circuit chip 13 during scanning. The reason is that the infrared microscope section is arranged in an inverse direction to that of the fifth embodiment. Furthermore, in the step S156, the integrated circuit chip 3 is set upside down so that its surface faces upward.

In the foregoing embodiments, for example, as shown in the step S205 of FIG. 7, the 256 tones are displayed with brightness or pseudo color. However, it is natural that the number of the bits of data to be processed and the number of tones to be displayed are not limited to these.

As described above, according to the first to seventh aspects of the present invention, the infrared beam is irradiated onto the semiconductor device as a sample, thereby detecting the variation of the voltage generated between the terminals or the variation of the current flowing through any terminal. Thus, it is possible to inspect the wiring system such as the stripes and the vias even in the event that the semiconductor substrate is included in the observation system. Therefore, it is possible to observe the current flowing through the wiring system and to detect the defect of the wiring system, even in the state of the finished product which was difficult to be inspected.

According to the third, fifth and sixth aspects of the present invention, it is possible to perform the inspection of two steps, namely, in the first step, the unusual current path is concluded by the current image using the infrared beam, and thereafter, in the second step, using the visible laser with a high spacial resolution, the defect image is observed by the selective scanning. A series of operations from the localization of the defective portion to the defect inspection is performed with a single apparatus.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An observation method for wiring current in a semiconductor device comprising:
   irradiating an infrared beam onto a region of a semiconductor device from at least one of: a back surface and a front surface of a chip; and
   detecting a variation in a current appearing at a predetermined terminal of said semiconductor device said variation being caused by irradiating the infrared beam, thereby observing a wiring current in said region, wherein the infrared beam has a wavelength of more than 1.24 µm.

2. The method of claim 1, wherein the infrared laser beam has an energy which is less than 1.0 V obtained by substracting an energy level between a donor level and an acceptor level.

3. An observation method for a semiconductor device comprising:
   irradiating an infrared beam onto a region of a semiconductor device from at least one of a back surface and a front surface of a semiconductor chip; and detecting a variation in an electrical characteristic of the semiconductor device at least one terminal of the semiconductor, said variation being caused by irradiation of the infrared beam, thereby inspecting said region for at least one of wiring current and defects, wherein the infrared beam has a wavelength of more than 1.24 µm.

4. The method of claim 3, wherein the infrared laser beam has an energy which is less than 1.0 V obtained by subtracting an energy level between a donor level and an acceptor level.

5. An observation method for a semiconductor device comprising:

irradiating an infrared beam onto a region of a semiconductor device from at least one of a back surface and a front surface of a semiconductor chip; and detecting a variation in an electrical characteristic of the semiconductor device at least one terminal of the semiconductor said variation being caused by irradiation of the infrared beam, thereby inspecting said region for at least one of wiring current and defects, wherein said electrical characteristic comprises a current at a predetermind terminal of said semiconductor device;

wherein the infrared beam has a wavelength of more than 1.24 µm.

6. The method of claim 5, wherein the infrared laser beam has an energy which is less than 1.0 V obtained by subtracting an energy level between a donor level and an acceptor level.

* * * * *